US012315717B2

(12) United States Patent
Tanemura et al.

(10) Patent No.: US 12,315,717 B2
(45) Date of Patent: May 27, 2025

(54) METHOD FOR MANUFACTURING METAL OXYNITRIDE FILM

(71) Applicant: SEMICONDUCTOR ENERGY LABORATORY CO., LTD., Atsugi (JP)

(72) Inventors: Kazuki Tanemura, Kanagawa (JP); Shota Sambonsuge, Chiba (JP); Naoki Okuno, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/232,881

(22) Filed: Aug. 11, 2023

(65) Prior Publication Data
US 2023/0402280 A1 Dec. 14, 2023

Related U.S. Application Data

(63) Continuation of application No. 17/257,071, filed as application No. PCT/IB2019/055287 on Jun. 24, 2019, now Pat. No. 11,728,163.

(30) Foreign Application Priority Data

Jul. 6, 2018 (JP) .................................. 2018-128964

(51) Int. Cl.
*H01L 21/00* (2006.01)
*C23C 14/08* (2006.01)
(Continued)

(52) U.S. Cl.
CPC ........ *H01L 21/02266* (2013.01); *C23C 14/08* (2013.01); *C23C 14/34* (2013.01); *H01L 21/02172* (2013.01); *H01L 21/02293* (2013.01)

(58) Field of Classification Search
CPC ......... H01L 21/02107; H01L 21/02172; H01L 21/02293; H01L 33/40; H01L 33/405;
(Continued)

(56) References Cited

U.S. PATENT DOCUMENTS 6,674,098 B1 1/2004 Niki et al.
6,987,029 B2 1/2006 Niki et al.
(Continued)

FOREIGN PATENT DOCUMENTS

CN 109196626 A 1/2019
EP 1199755 A 4/2002
(Continued)

OTHER PUBLICATIONS

Matsushima.K et al., "Epitaxial Growth of ZnInON Films with Tunable Band Gap from 1.7 to 3.3 eV on ZnO Templates", Jpn. J. Appl. Phys. (Japanese Journal of Applied Physics), Nov. 1, 2013, vol. 52, No. 11S, p. 11NM06-1-11NM06-5, The Japan Society of Applied Physics.

(Continued)

*Primary Examiner* — Reema Patel
(74) *Attorney, Agent, or Firm* — Fish & Richardson P.C.

(57) ABSTRACT

A method for depositing a metal oxynitride film by epitaxial growth at a low temperature is provided. It is a method for manufacturing a metal oxynitride film, in which the metal oxynitride film is epitaxially grown on a single crystal substrate by a sputtering method using an oxide target with a gas containing a nitrogen gas introduced. The oxide target contains zinc, the substrate during the deposition of the metal oxynitride film is higher than or equal to 80° C. and lower than or equal to 400° C., and the flow rate of the nitrogen gas is greater than or equal to 50% and lower than or equal to 100% of the total flow rate of the gas.

20 Claims, 23 Drawing Sheets

(51) Int. Cl.
  *C23C 14/34* (2006.01)
  *H01L 21/02* (2006.01)
(58) Field of Classification Search
  CPC ....... H01L 33/42; H10F 77/20; H10F 77/244; H10F 77/251
  See application file for complete search history.

(56) References Cited

U.S. PATENT DOCUMENTS

| | | | |
|---|---|---|---|
| 7,061,014 | B2 | 6/2006 | Hosono et al. |
| 7,605,012 | B2 | 10/2009 | Niki et al. |
| 7,956,356 | B2 | 6/2011 | Tanikella et al. |
| 8,274,078 | B2 | 9/2012 | Itagaki et al. |
| 8,679,650 | B2 | 3/2014 | Itagaki et al. |
| 10,461,197 | B2 | 10/2019 | Yamazaki |
| 2002/0172820 | A1* | 11/2002 | Majumdar ............. B82Y 20/00 257/E21.12 |
| 2010/0092800 | A1* | 4/2010 | Itagaki .................. C30B 29/406 204/192.15 |
| 2015/0340505 | A1 | 11/2015 | Yamazaki et al. |
| 2017/0352763 | A1 | 12/2017 | Yamazaki |
| 2018/0339912 | A1* | 11/2018 | Natali ............... H01L 21/02381 |
| 2020/0013894 | A1 | 1/2020 | Yamazaki |

FOREIGN PATENT DOCUMENTS

| | | |
|---|---|---|
| EP | 1443130 A | 8/2004 |
| EP | 1912298 A | 4/2008 |
| EP | 2175054 A | 4/2010 |
| EP | 2671975 A | 12/2013 |
| EP | 2865790 A | 4/2015 |
| JP | 07-262801 A | 10/1995 |
| JP | 2001-044500 A | 2/2001 |
| JP | 2004-103957 A | 4/2004 |
| JP | 2008-270749 A | 11/2008 |
| JP | 2009-275236 A | 11/2009 |
| JP | 2010-114423 A | 5/2010 |
| JP | 2011-029238 A | 2/2011 |
| JP | 2012-250344 A | 12/2012 |
| JP | 2014-029238 A | 2/2014 |
| JP | 2015-018929 A | 1/2015 |
| JP | 2017-216445 A | 12/2017 |
| JP | 2017-218675 A | 12/2017 |
| KR | 2019-0013872 A | 2/2019 |
| WO | WO-2001/008229 | 2/2001 |
| WO | WO-2008/083073 | 7/2008 |
| WO | WO-2008/133345 | 11/2008 |
| WO | WO-2017/204197 | 11/2017 |
| WO | WO-2017/208109 | 12/2017 |

OTHER PUBLICATIONS

International Search Report (Application No. PCT/IB2019/055287) Dated Oct. 1, 2019.
Written Opinion (Application No. PCT/IB2019/055287) Dated Oct. 1, 2019.
Nomura.K et al., "Thin-Film Transistor Fabricated in Single-Crystalline Transparent Oxide Semiconductor", Science, May 23, 2003, vol. 300, No. 5623, pp. 1269-1272.
Futsuhara.M et al., "Optical properties of zinc oxynitride thin films", Thin Solid Films, Apr. 1, 1998, vol. 317, pp. 322-325, Elsevier.
Chinese Office Action (Application No. 201980039953.X) Dated Jan. 9, 2024.

* cited by examiner

100

100

FIG. 21A
FIG. 21B
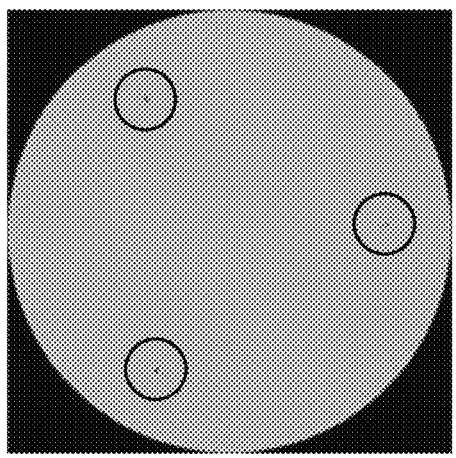
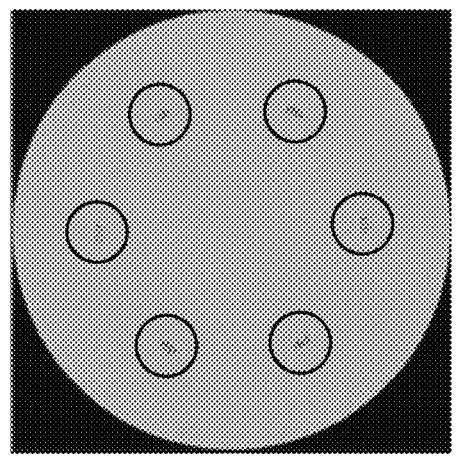

METHOD FOR MANUFACTURING METAL OXYNITRIDE FILM

CROSS REFERENCE TO RELATED APPLICATIONS

This application is a continuation of U.S. application Ser. No. 17/257,071, filed Dec. 30, 2020, now allowed, which is incorporated by reference and is a U.S. National Phase Application under 35 U.S.C. § 371 of International Application PCT/IB2019/055287, filed on Jun. 24, 2019, which is incorporated by reference and claims the benefit of a foreign priority application filed in Japan on Jul. 6, 2018, as Application No. 2018-128964.

TECHNICAL FIELD

One embodiment of the present invention relates to a metal oxynitride film and a method for manufacturing the metal oxynitride film. In addition, one embodiment of the present invention relates to a light-emitting element, a lighting device, a display device, an electronic device, and a semiconductor device that include the metal oxynitride film.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A metal oxynitride, which includes metal, oxygen, and nitrogen, is known as a pigment or a photocatalyst material. In addition, a metal oxynitride has attracted attention as a semiconductor material or an insulating material used for a semiconductor device or the like. Patent Document 1 discloses a semiconductor material including a metal oxynitride containing indium, gallium, and zinc.

As one of methods for forming an in-plane oriented thin film (also referred to as a single crystal thin film), an epitaxial growth method is known. Here, in-plane orientation refers to the regularity of crystal orientation in a horizontal direction with respect to a substrate. Patent Document 2 discloses a method for forming a single crystal InGaO$_3$(ZnO)$_5$ thin film by a reactive solid-phase epitaxial method.

REFERENCE

Patent Document

[Patent Document 1] Japanese Published Patent Application No. 2015-18929

[Patent Document 2] Japanese Published Patent Application No. 2004-103957

SUMMARY OF THE INVENTION

Problems to be Solved by the Invention

The state of the metal oxynitride disclosed in Patent Document 1 is an amorphous state where an interatomic bond is disordered. The metal oxynitride in an amorphous state has a void or a low-density region, and therefore, the stability of the metal oxynitride is low. Accordingly, it is preferable that a metal oxynitride used for a semiconductor device or the like have high crystallinity. It is particularly preferable that the metal oxynitride have in-plane orientation.

The reactive solid-phase epitaxy method disclosed in Patent Document 2 requires high-temperature treatment; for example, treatment for heating a substrate to 1000° C. or higher is performed before deposition of an InGaO$_3$(ZnO)$_5$ thin film, and heat diffusion treatment is performed at 1300° C. or higher after the deposition of the thin film. Furthermore, to form a single crystal InGaO$_3$(ZnO)$_5$ thin film, an epitaxially grown ZnO thin film needs to be provided on the substrate. In this manner, there are various limitations on formation of an epitaxially grown thin film by a conventional technique. Note that in this specification, a high temperature refers to a temperature of 700° C. or higher, and a low temperature refers to a temperature of 600° C. or lower, for example.

Thus, an object of one embodiment of the present invention is to provide a method for depositing a metal oxynitride film by epitaxial growth at a low temperature. Another object of one embodiment of the present invention is to provide a method for depositing a metal oxynitride film by epitaxial growth without high-temperature treatment before and after the deposition of the metal oxynitride film. Another object of one embodiment of the present invention is to provide a semiconductor device or the like including a metal oxynitride film deposited by epitaxial growth.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a method for manufacturing a metal oxynitride film, in which the metal oxynitride film is epitaxially grown on a single crystal substrate by a sputtering method using an oxide target with a gas containing a nitrogen gas introduced. The oxide target contains zinc, the substrate during the deposition of the metal oxynitride film is higher than or equal to 80° C. and lower than or equal to 400° C., and the flow rate of the nitrogen gas is greater than or equal to 50% and lower than or equal to 100% of the total flow rate of the gas.

One embodiment of the present invention is a method for manufacturing a metal oxynitride film, in which an in-plane oriented film is deposited on a single crystal substrate by a sputtering method using an oxide target with a gas containing a nitrogen gas introduced. The oxide target contains zinc, the substrate during the deposition of the metal oxynitride film is higher than or equal to 80° C. and lower than or equal to 400° C., and the flow rate of the nitrogen gas is greater than or equal to 50% and lower than or equal to 100% of the total flow rate of the gas.

In the method for manufacturing a metal oxynitride film, the oxide target preferably contains at least one of indium and gallium.

In the method for manufacturing a metal oxynitride film, it is preferable that the substrate be an yttria-stabilized zirconia (YSZ) substrate, and a plane orientation of the substrate be (111). Alternatively, it is preferable that the substrate be an A-plane sapphire substrate, and a plane orientation of the substrate be (110).

In the method for manufacturing a metal oxynitride film, the crystal structure of the metal oxynitride film is preferably a wurtzite structure.

In the method for manufacturing a metal oxynitride film, when pole measurement is performed on the metal oxynitride film, a diffraction peak indicating six-fold symmetry is preferably observed in a φ scan on a (101) plane of a crystal of the metal oxynitride film in the pole measurement.

In the method for manufacturing a metal oxynitride film, it is preferable that a first spot and a second spot be observed in a wide-angle reciprocal space map of the metal oxynitride film, a peak of the first spot be positioned at an angle 2θ of greater than or equal to 30° and less than or equal to 35° and an angle ψ of around 0°, a half-width of the first spot be less than 2°, a peak of the second spot be positioned at an angle 2θ of greater than or equal to 33° and less than or equal to 37° and an angle ψ of greater than or equal to 61° and less than or equal to 65°, and a half-width of the second spot be less than 2°.

Effect of the Invention

According to one embodiment of the present invention, a method for depositing a metal oxynitride film by epitaxial grown at a low temperature can be provided. According to one of the present invention, a method for depositing a metal oxynitride film by epitaxial growth without high-temperature treatment before and after the deposition of the metal oxynitride film can be provided. According to one of the present invention, a semiconductor device or the like including a metal oxynitride film deposited by epitaxial growth can be provided.

Note that the descriptions of the effects do not disturb the existence of other effects. One embodiment of the present invention does not have to have all of these effects. Effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 21(A) and FIG. 21(B) are diagrams showing results of pole measurement on Sample 6 of Example.

MODE FOR CARRYING OUT THE INVENTION

Figure 1A:
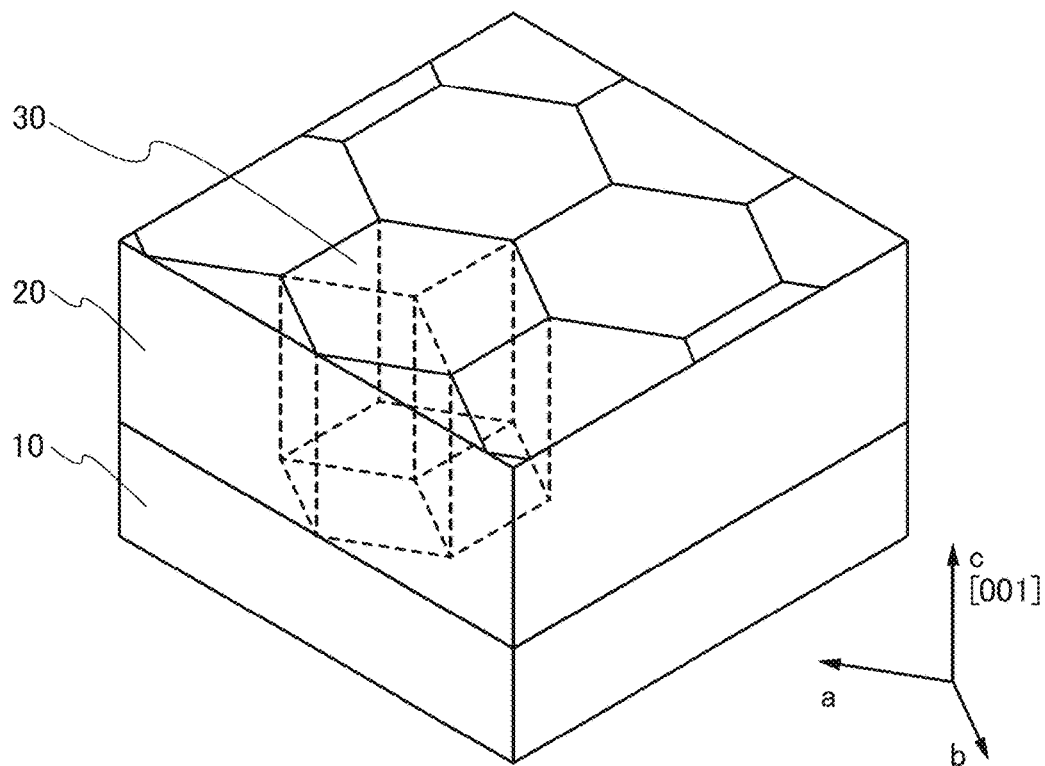
FIG. 1(A) is a diagram showing a metal oxynitride film that is epitaxially grown on a substrate.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In addition, in the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

In a top view (also referred to as a plan view), a perspective view, or the like, particularly, some components might not be illustrated for easy understanding of the invention. In addition, some hidden lines and the like might not be shown.

In addition, in this specification and the like, terms for describing arrangement, such as "over" and "below", are used for convenience to describe the positional relationship between components with reference to drawings. Furthermore, the positional relationship between components is changed as appropriate in accordance with a direction in which the components are described. Thus, terms for the description are not limited to terms used in the specification, and description can be made appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel region refers to a region through which current mainly flows.

Furthermore, functions of a source and a drain might be interchanged with each other when a transistor of opposite polarity is employed or when the direction of current is changed in circuit operation, for example Therefore, the terms "source" and "drain" can sometimes be interchanged with each other in this specification and the like.

In addition, in this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In addition, in this specification and the like, "parallel" indicates a state where two straight lines are placed at an angle of greater than or equal to $-10°$ and less than or equal to $10°$. Accordingly, the case where the angle is greater than or equal to $-5°$ and less than or equal to $5°$ is also included. In addition, the term "substantially parallel" indicates a state where two straight lines are placed at an angle greater than or equal to $-30°$ and less than or equal to $30°$. Furthermore, "perpendicular" indicates a state where two straight lines are placed at an angle of greater than or equal to $80°$ and less than or equal to $100°$. Accordingly, the case where the angle is greater than or equal to $85°$ and less than or equal to $95°$ is also included. Furthermore, "substantially perpendicular" indicates a state where two straight lines are placed at an angle greater than or equal to $60°$ and less than or equal to $120°$.

In this specification, a crystal plane is represented by Miller indices. Miller indices are expressed by three integers in parentheses. The direction of crystal plane alignment (a direction perpendicular to the crystal plane) is referred to as a crystal orientation. The crystal orientation is expressed by three integers in square brackets. For example, a crystal plane is expressed as (111), and a crystal orientation is expressed as [111]. Note that in the case of a hexagonal system, a notation called Miller-Bravais indices may be used. Specifically, plane indices of a hexagonal crystal lattice are represented, using four integers (h, k, i, and l), as (hkil). Here, $i=-(h+k)$. The index i can be calculated from the values of the index h and the index k; therefore, in this specification, a crystal plane of a hexagonal system is also represented by a notation using three integers, Miller indices (hkl).

In addition, in this specification, a crystal plane that appears at a surface of a single crystal substrate may be referred to as a plane orientation of the single crystal substrate.

In this specification, a lattice point in a reciprocal lattice (also referred to as a reciprocal lattice point), which corresponds to a crystal plane, is represented by indices without parentheses. For example, a reverse lattice point 111 shown as a spot observed in a wide-angle reciprocal lattice space map corresponds to a crystal plane (111).

Furthermore, a bar is put over a number representing an index when the index represents a negative direction in the Mirror indices; however, in this specification, a negative sign is put before the number representing the index for convenience. In addition, (-111), (1-11), (11-1), and the like are given as planes equivalent to (111). When (111) is described in this specification, the (111) may include equivalent planes such as (-111), (1-11), and (11-1).

Embodiment 1

In this embodiment, a method for manufacturing a metal oxynitride film of one embodiment of the present invention will be described.

A metal oxynitride, which includes metal, oxygen, and nitrogen, has attracted attention as a semiconductor material or an insulating material used in a semiconductor device. It is preferable that a metal oxynitride used in a semiconductor device have a low amount of impurities or defects and high stability. Here, the high stability of the metal oxynitride refers to, for example, a less tendency to react with a material in contact with the metal oxynitride, a less tendency to change in the crystallinity of the metal oxynitride, and a less tendency to cause defects in the metal oxynitride, owing to heat or the like generated by operation of the semiconductor device. The use of the metal oxynitride with a low amount of impurities or defects and high stability in a semiconductor device can improve the reliability of the semiconductor device.

The impurities in the metal oxynitride refer to, for example, components other than main components that compose the metal oxynitride. For example, an element that is contained in the metal oxynitride at a concentration lower than 0.1 atomic % can be regarded as an impurity. Examples of the element include hydrogen, silicon, boron, phosphorus, carbon, and a transition metal except the main components composing the metal oxynitride. The defects in the metal oxynitride refer to lattice defects; examples of the defects include a point defect such as an oxygen vacancy and a nitrogen vacancy, a line defect such as dislocation, and a plane defect such as a crystal grain boundary. In addition, a void defect such as a void, and the like are given as the defects in the metal oxynitride.

Examples of a thin film include an in-plane oriented thin film, an orientation thin film, a non-oriented thin film (polycrystalline thin film), and an amorphous thin film, in terms of crystallinity. An orientation thin film is a thin film in which at least one crystal axis of each crystal of the thin film is aligned in a particular direction. An in-plane oriented thin film is a thin film in which three crystal axes of each crystal of the thin film are aligned in particular directions.

A thin film of a metal oxynitride that is used in a semiconductor device or the like is preferably a thin film of a metal oxynitride having orientation, further preferably an in-plane oriented thin film of a metal oxynitride. The in-plane oriented thin film of a metal oxynitride has a small amount of impurities or defects and a dense structure. Thus, the use of the in-plane oriented thin film of a metal oxynitride in a semiconductor device or the like can improve the reliability of the semiconductor device or the like.

Epitaxial growth is known as a method for forming an in-plane oriented thin film Epitaxial growth means that a crystal forming a thin film is grown on a single crystal substrate with a certain crystal orientation relation. Note that growth of a crystal on a single crystal substrate using the same material as the substrate, in which the crystal has the same lattice constant as a crystal of the substrate, is called homoepitaxial growth. In addition, growth of a crystal on a single crystal substrate using a different material from the substrate or a material having a different lattice constant from a crystal of the substrate is called heteroepitaxial growth. The heteroepitaxial growth becomes possible when a material that has small lattice mismatch with respect to the crystal of the substrate is selected, or when a layer that relieves lattice distortion (also referred to as a buffer layer) is provided between the substrate and the thin film, for example.

A solid phase epitaxy (SPE) method, a liquid phase epitaxy (LPE) method, and a vapor phase epitaxy (VPE) method are given as the method of epitaxial growth.

The SPE method is a method in which a thin film is formed on a substrate surface and is heated by electron beam irradiation or the like, so that the crystal structure of the thin film is changed into the same crystal structure as a crystal of the substrate. The LPE method is a method for separating a crystal part from a supersaturated solution onto a substrate surface. The VPE method is a method for depositing a component in a vapor phase onto a substrate surface. Examples of the VPE method include a pulsed laser deposition (PLD) method, an atomic layer deposition (ALD) method, and a molecular beam epitaxy (MBE) method. The MBE method is a method in which an element constituting a target crystal or a material containing the element is heated and evaporated in ultrahigh vacuum and a crystal is deposited on the heated substrate.

A conventional technique for epitaxial growth of a thin film has various conditions. Examples of the conditions are as follows: the thin film is deposited at a high temperature; the thin film is subjected to heat treatment at a high temperature (e.g., 1000° C. or higher) after the deposition of the thin film; a substrate surface is subjected to planarization treatment before deposition of the thin film; one or more buffer layers are provided on the substrate; a substrate that has a similar lattice constant or thermal expansion is selected. As the planarization treatment on the substrate surface, heat treatment is performed on the substrate at a high temperature, for example.

In view of the above, one embodiment of the present invention is a method for manufacturing a metal oxynitride film, in which the metal oxynitride film is epitaxially grown at a low temperature. Specifically, the manufacturing method is a method in which a metal oxynitride film is epitaxially grown on a single crystal substrate by a sputtering method with a gas introduced into a reaction chamber. Note that one embodiment of the present invention is a manufacturing method in which an in-plane oriented film is formed by epitaxial growth; therefore, a film that is epitaxially grown by the manufacturing method is an in-plane oriented film.

The crystal structure of the metal oxynitride film that is epitaxially grown is preferably a hexagonal crystal structure. Among the hexagonal crystal structures, a wurtzite structure is particularly preferable. The wurtzite structure has a crystal orientation relationship that enables epitaxial growth with respect to a cubic crystal system (e.g., a diamond structure, a fluorite structure, or a zinc blende structure). For example, there is a crystal orientation relationship enabling epitaxial growth between [111] of a cubic crystal and [001] of a wurtzite structure. Accordingly, a metal oxynitride film that has a hexagonal crystal structure can be easily epitaxially grown on a single crystal substrate that has a crystal structure such as a cubic crystal structure or a hexagonal crystal structure. Furthermore, a material that has a crystal structure such as a cubic crystal structure or a hexagonal crystal structure can be easily epitaxially grown on the metal oxynitride film.

As the single crystal substrate, an insulator substrate such as a sapphire substrate or a stabilized zirconia substrate (e.g., an yttria-stabilized zirconia (YSZ) substrate) can be used. In the case where the crystal structure of the metal oxynitride is a wurtzite structure, an YSZ substrate with a (111) plane orientation or an A-plane sapphire substrate with a (110) plane orientation is preferably used as the substrate, for example. The use of the YSZ substrate or the A-plane sapphire substrate as the substrate facilitates formation of an in-plane oriented thin film of a metal oxynitride with a wurtzite structure. Note that a semiconductor substrate made of silicon, germanium, silicon carbide, gallium nitride, gallium arsenide, indium phosphide, or zinc oxide may be used.

It is preferable that a difference in lattice constant (also referred to as lattice mismatch) between the crystal of the epitaxially grown thin film and the crystal of the substrate be small. The reduction in the lattice mismatch facilitates epitaxial growth of the thin film on the single crystal substrate.

One of methods for evaluating the degree of lattice mismatch is a lattice mismatch $\Delta a$, which is calculated by the following formula (1) with a lattice constant $a_e$ of the crystal of the epitaxially grown thin film and a lattice constant $a_s$ of the crystal of the substrate.

[Formula 1]
$$\Delta a = \frac{|a_e - a_s|}{a_e} \quad (1)$$

The lattice mismatch between the metal oxynitride film to be epitaxially grown and the single crystal substrate is preferably less than or equal to 15%, further preferably less than or equal to 10%. Thus, the metal oxynitride film can be easily epitaxially grown on the single crystal substrate.

Note that in the case where a metal oxynitride film including a crystal with a wurtzite structure is epitaxially grown on a single crystal substrate of a cubic system, for example, the crystal orientation of the substrate surface is [111] and the crystal orientation of the metal oxynitride film surface is [001]; therefore, the substrate and the metal oxide film have different crystal orientations. In that case, $a_s$ is set to a value obtained by multiplying the lattice constant of the crystal of the substrate by the square root of two over two, whereby the lattice mismatch can be calculated. Specifically, in the case where an YSZ substrate with a lattice constant of approximately 0.51 nm in the a-axis direction is used as the single crystal substrate, the nearest neighbor interatomic distance is approximately 0.36 nm at the minimum when the YSZ substrate is seen from the [111] direction. Therefore, in view of the above-described preferred range of the lattice mismatch, the lattice constant of the crystal of the metal oxynitride film in the a-axis direction is preferably greater than or equal to 0.31 nm and less than or equal to 0.41 nm, further preferably greater than or equal to 0.32 nm and less than or equal to 0.40 nm.

FIG. 1(A) is a schematic diagram of a structure body including a metal oxynitride film that is epitaxially grown on a single crystal substrate. FIG. 1(A) is the schematic diagram of the structure body in which a metal oxynitride film 20 is deposited on a single crystal substrate 10. FIG. 1(A) illustrates the case where the metal oxynitride film 20 includes a crystal 30 with a wurtzite structure. The metal oxynitride film 20 is epitaxially grown by the manufacturing method of one embodiment of the present invention so that a c-axis ([001]) direction of the crystal 30 with the wurtzite structure corresponds to the normal direction of a surface of the single crystal substrate 10. Here, since the c-axis ([001]) direction of the crystal included in the film epitaxially grown by the manufacturing method of one embodiment of the present invention corresponds to the normal direction of the surface of the single crystal substrate, the film that is epitaxially grown by the manufacturing method of one embodiment of the present invention is referred to as a c-axis epitaxial film in some cases.

Figure 1B:
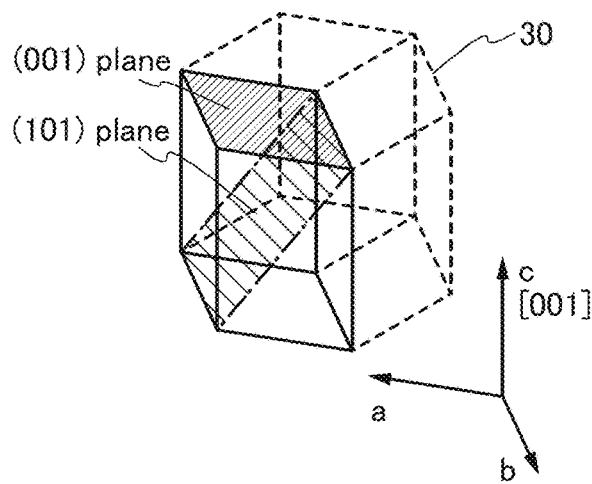
FIG. 1(B) is a diagram showing crystal planes of a crystal included in the metal oxynitride film.

A crystal plane of a wurtzite structure is described with reference to FIG. 1(B). FIG. 1(B) illustrates typical crystal planes (a (001) plane and a (101) plane) of a wurtzite structure. The (001) plane of the wurtzite structure illustrated in FIG. 1(B) is a plane parallel to the surface of the single crystal substrate 10.

Figure 1C:
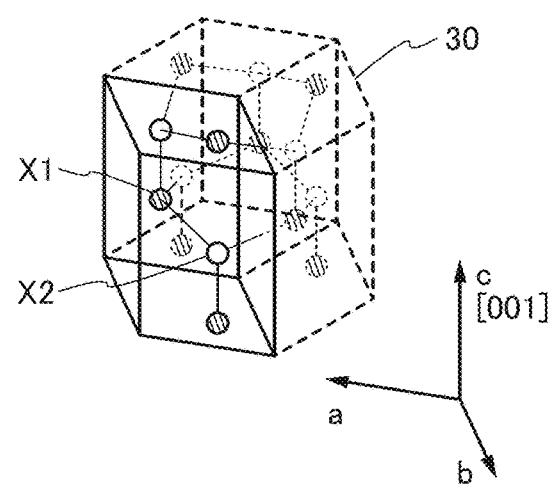
FIG. 1(C) is a diagram showing atomic arrangement of the crystal.

FIG. 1(C) illustrates atomic arrangement in the wurtzite structure. In FIG. 1(C), a position X1 is a position for a metal atom, and a position X2 is a position for an oxygen atom or a nitrogen atom. Note that the position X1 may be the position for an oxygen atom or a nitrogen atom, and the position X2 may be the position for a metal atom.

A sputtering target used for the sputtering method is preferably an oxide target containing zinc, further preferably an oxide target containing at least one of indium and gallium, and zinc. As the oxide target, a zinc oxide target, an indium zinc oxide (In—Zn oxide) target, a gallium zinc oxide (Ga—Zn oxide) target, an indium gallium zinc oxide (In—Ga—Zn oxide) target, or the like can be used, for example. In particular, an indium gallium zinc oxide target is preferably used as the oxide target. The crystal structures of indium nitride, gallium nitride, and zinc oxide are each a wurtzite structure. Therefore, deposition with the oxide target facilitates formation of an in-plane oriented metal oxynitride thin film with a wurtzite structure.

Figure 2:
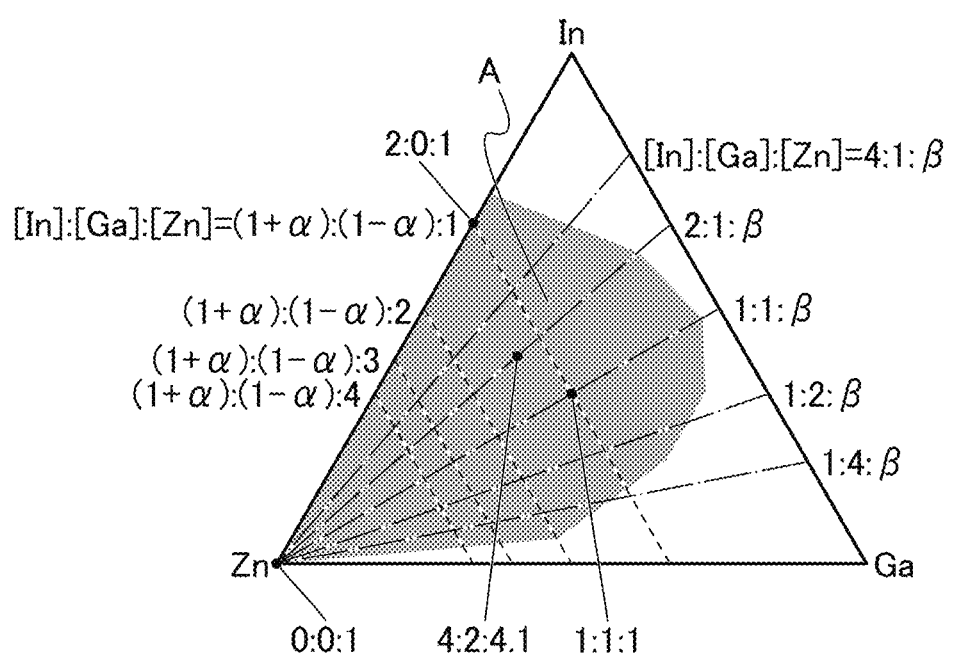
FIG. 2 is a diagram showing a range of the atomic ratio of metals included in an oxide target.

A preferred range of the atomic ratio of metals contained in the oxide target is described with reference to FIG. 2. FIG. 2 shows the atomic ratio of indium, gallium, and zinc contained in the oxide target. Note that the proportion of oxygen atoms is not shown in FIG. 2. In addition, the terms of the atomic ratio of indium, gallium, and zinc contained in the oxide target are denoted by [In], [Ga], and [Zn], respectively.

In FIG. 2, broken lines indicate a line representing the atomic ratio of [In]:[Ga]:[Zn]=(1+α):(1−α):1 (α is a real number of −1 to 1), a line representing the atomic ratio of [In]:[Ga]:[Zn]=(1+α): 1−α):2, a line representing the atomic ratio of [In]:[Ga]:[Zn]=(1+α):(1−α):3, and a line representing the atomic ratio of [In]:[Ga]:[Zn]=(1+α):(1−α):4.

Furthermore, dashed-dotted lines indicate a line representing the atomic ratio of [In]:[Ga]:[Zn]=4:1:β (β is a real number of 0 or more), a line representing the atomic ratio of [In]:[Ga]:[Zn]=2:1:β, a line representing the atomic ratio of [In]:[Ga]:[Zn]=1:1:β, a line representing the atomic ratio of [In]:[Ga]:[Zn]=1:2:β, and a line representing the atomic ratio of [In]:[Ga]:[Zn]=1:4:β.

A region A shown in FIG. 2 represents an example of the preferred range of the atomic ratio of indium, gallium, and zinc contained in the oxide target. The region A includes In—Ga—Zn oxide targets with [In]:[Ga]:[Zn]=4:2:4.1 and [In]:[Ga]:[Zn]=1:1:1, an In—Zn oxide target with [In]:[Ga]:[Zn]=2:0:1 ([In]:[Zn]=2:1), and a zinc oxide target with [In]:[Ga]:[Zn]=0:0:1.

Note that the sputtering target used for the sputtering method is not limited to an oxide target and may be an oxynitride target. As the oxynitride target, for example, an indium gallium zinc oxynitride (In—Ga—Zn oxynitride) target, an indium gallium oxynitride (In—Ga oxynitride) target, an indium zinc oxynitride (In—Zn oxynitride) target, or the like can be used.

A substrate temperature during the deposition of the metal oxynitride film is preferably higher than or equal to a room temperature (25° C.) and lower than or equal to 500° C., further preferably higher than or equal to 80° C. and lower than or equal to 400° C., still further preferably higher than or equal to 100° C. and lower than or equal to 250° C. Since deposition can be performed at a substrate temperature lower than or equal to 500° C., the productivity of a semiconductor device or the like using the metal oxynitride film can be improved.

A gas containing a nitrogen gas is preferably used as the gas introduced into the reaction chamber for the deposition of the metal oxynitride film. For example, it is preferable that a nitrogen gas, a mixed gas of a nitrogen gas and an oxygen gas, a mixed gas of a nitrogen gas and a rare gas (e.g., argon or helium), or the like be used as the gas. Here, the flow rate of the nitrogen gas is preferably higher than or equal to 50% and lower than or equal to 100% of the total flow rate of the gas. The composition of the metal oxynitride film to be obtained can be adjusted by adjustment of the flow rate ratio of the nitrogen gas to the flow rate of the gas.

The above manufacturing method allows epitaxial growth of the metal oxynitride film without provision of a buffer layer between the substrate the thin film <Sputtering Apparatus>

Figure 3A:
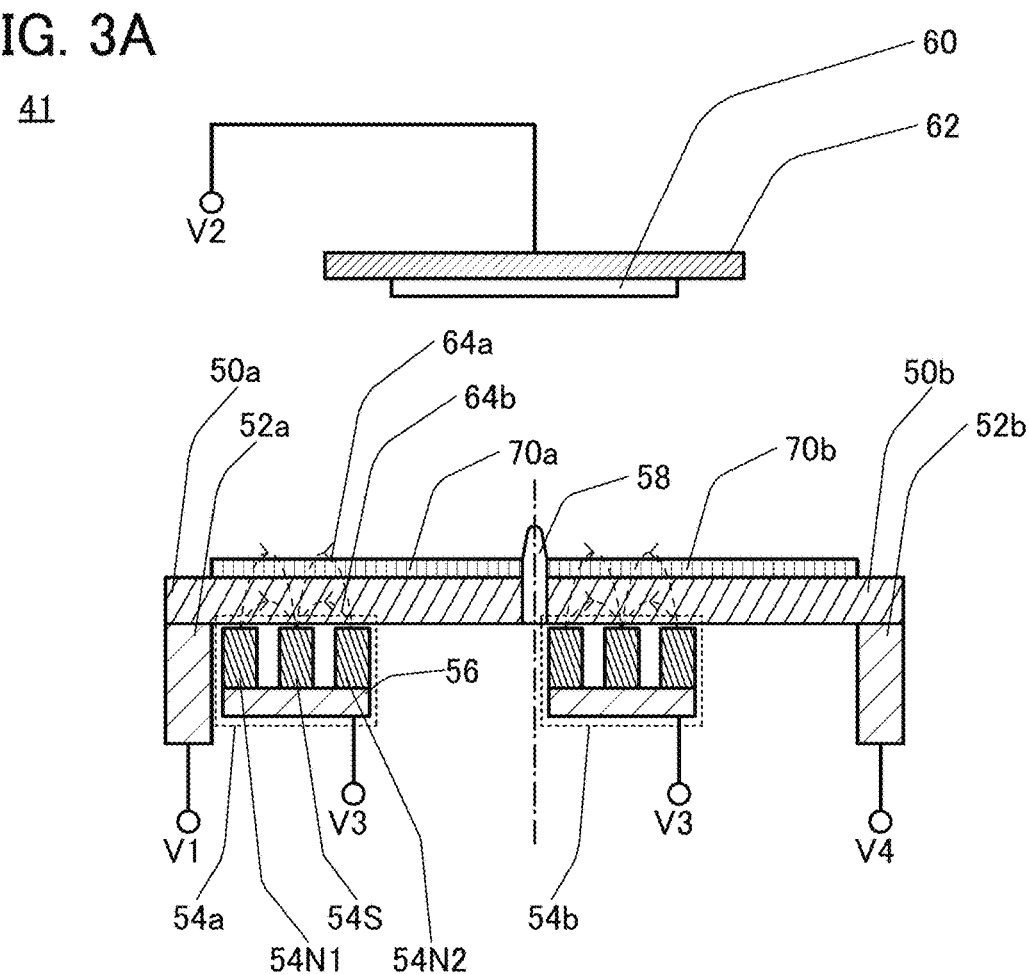
FIG. 3(A) and FIG. 3(B) are schematic diagrams showing a sputtering apparatus.

Next, a sputtering apparatus that is involved in the method for manufacturing a metal oxynitride film of one embodiment of the present invention is described with reference to FIG. 3(A) and FIG. 3(B). FIG. 3(A) is a cross-sectional view illustrating a deposition chamber 41 included in the sputtering apparatus and FIG. 3(B) is a plan view of a magnet unit 54a and a magnet unit 54b included in the sputtering apparatus.

The deposition chamber 41 illustrated in FIG. 3(A) includes a target holder 52a, a target holder 52b, a backing plate 50a, a backing plate 50b, a sputtering target 70a, a sputtering target 70b, a member 58, and a substrate holder 62. Note that the sputtering target 70a is positioned over the backing plate 50a. The backing plate 50a is positioned over the target holder 52a. The magnet unit 54a is positioned under the sputtering target 70a with the backing plate 50a therebetween. The sputtering target 70b is positioned over the backing plate 50b. The backing plate 50b is positioned over the target holder 52b. The magnet unit 54b is positioned under the sputtering target 70b with the backing plate 50b therebetween.

Figure 3B:
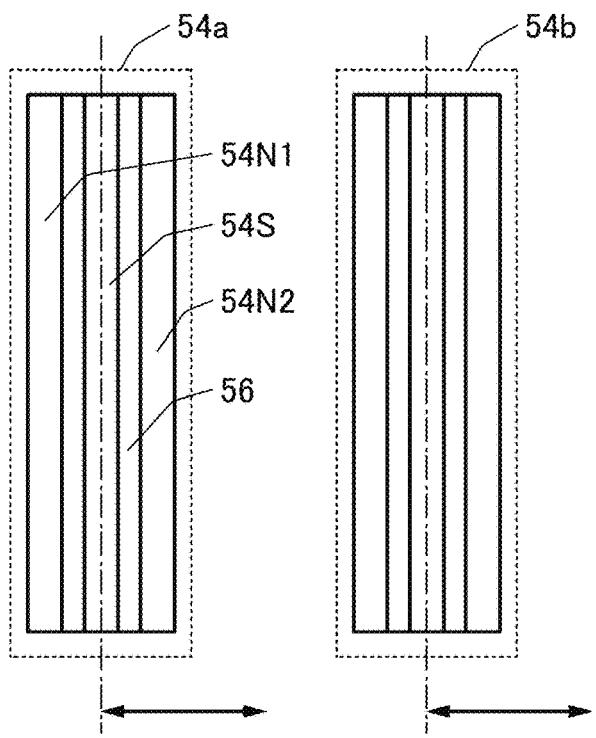

As illustrated in FIG. 3(A) and FIG. 3(B), the magnet unit 54a includes a magnet 54N1, a magnet 54N2, a magnet 54S, and a magnet holder 56. The magnet 54N1, the magnet 54N2, and the magnet 54S are positioned over the magnet holder 56 in the magnet unit 54a. The magnet 54N1 and the magnet 54N2 are positioned so as to be apart from the magnet 54S. Note that the magnet unit 54b has a structure similar to that of the magnet unit 54a. When a substrate 60 is transferred into the deposition chamber 41, the substrate 60 is positioned in contact with the substrate holder 62.

The sputtering target 70a, the backing plate 50a, and the target holder 52a are separated from the sputtering target 70b, the backing plate 50b, and the target holder 52b by the member 58. Note that the member 58 is preferably an insulator. The member 58 may be a conductor or a semiconductor. The member 58 may be a conductor or a semiconductor whose surface is covered with an insulator.

The target holder 52a and the backing plate 50a are fixed to each other with a screw (e.g., a bolt) and have the same potential. The target holder 52a has a function of supporting the sputtering target 70a with the backing plate 50a therebetween. The target holder 52b and the backing plate 50b are fixed to each other with a screw (e.g., a bolt) and have the same potential. The target holder 52b has a function of supporting the sputtering target 70b with the backing plate 50b therebetween.

The backing plate 50a has a function of fixing the sputtering target 70a. The backing plate 50b has a function of fixing the sputtering target 70b.

Note that a magnetic line of force 64a and a magnetic line of force 64b formed by the magnet unit 54a are illustrated in FIG. 3(A).

As illustrated in FIG. 3(B), the magnet unit 54a has a structure in which the magnet 54N1 having a rectangular or substantially rectangular shape, the magnet 54N2 having a rectangular or substantially rectangular shape, and the magnet 54S having a rectangular or substantially rectangular shape are fixed to the magnet holder 56. The magnet unit 54a can be oscillated horizontally as shown by an arrow in FIG. 3(B). For example, the magnet unit 54a is oscillated with a beat (also referred to as rhythm, count, pulse, frequency, period, cycle, or the like) of greater than or equal to 0.1 Hz and less than or equal to 1 kHz.

The magnetic field over the sputtering target 70a changes in accordance with oscillation of the magnet unit 54a. A region with an intense magnetic field is a high-density plasma region; thus, sputtering phenomenon of the sputtering target 70a easily occurs in the vicinity of the region. The same applies to the magnet unit 54b.

FIG. 3(A) and FIG. 3(B) illustrate an example in which a parallel-plate sputtering apparatus is used; however, the method for depositing a metal oxynitride film according to this embodiment is not limited thereto. For example, a metal oxynitride film may be deposited using a facing-target sputtering apparatus.

A sputtering method, which enables low-temperature deposition, can increase the productivity of a semiconductor device or the like using the metal oxynitride film.

According to one embodiment of the present invention, a method for depositing a metal oxynitride film by epitaxial growth at a low temperature can be provided. According to one embodiment of the present invention, a method for depositing a metal oxynitride film by epitaxial growth without high-temperature treatment before and after the deposition of the metal oxynitride film can be provided. According to one embodiment of the present invention, a semiconductor device or the like including a metal oxynitride film deposited by epitaxial growth can be provided. According to one embodiment of the present invention, the productivity of a semiconductor device or the like including a metal oxynitride film can be increased.

<Method for Evaluating Crystallinity and Orientation of Thin Film>

Evaluation of epitaxial growth can be conducted during or after deposition of the thin film depending on an evaluation method.

Examples of a method for evaluating epitaxial growth during deposition of the thin film include reflection high energy electron diffraction (RHEED) and surface photoabsorption (SPA).

Epitaxial growth (crystallinity and orientation) of a deposited thin film can be evaluated by a combination of a transmission electron microscope (TEM); reciprocal lattice space mapping, wide-angle reciprocal space mapping (WRSM), pole measurement, out-of-plane measurement, and in-plane measurement of an X-ray diffraction (XRD) method; and the like.

A measurement method that can be used for evaluating the crystallinity and orientation of a thin film will be described below.

<Wide-Angle Reciprocal Space Mapping>

Wide-angle reciprocal space mapping is described.

A reciprocal space is a space that is composed of a basic vector of a reciprocal space (also referred to as a reciprocal vector) and reflects the periodicity of the real space. Here, a reciprocal vector $b_j$ and a basic vector $a_i$ of the real space have a relationship shown in the following formula (2). In the formula (2), $\delta_{i,j}$ is Kronecker delta. That is, a plane defined in a crystal of the real space is regarded as a lattice point in a reciprocal lattice.

[Formula 2]

$$a_i \cdot b_j = 2\pi \delta_{i,j} \quad (2)$$

An epitaxially grown thin film has a small variation in the crystal orientation of crystals included in the thin film, i.e., high orientation. Thus, when a reciprocal space map of the epitaxially grown thin film is obtained, the intensity of an observed spot is high, and a half-width of the spot is small. In contrast, when a reciprocal space map of a thin film with a large variation in the crystal orientation, i.e., low orientation, of the crystals, is obtained, the intensity of an observed spot is low and the half-width of the spot is large. In this manner, the reciprocal space map is obtained, whereby the crystallinity and orientation of the thin film can be evaluated.

Figure 4:
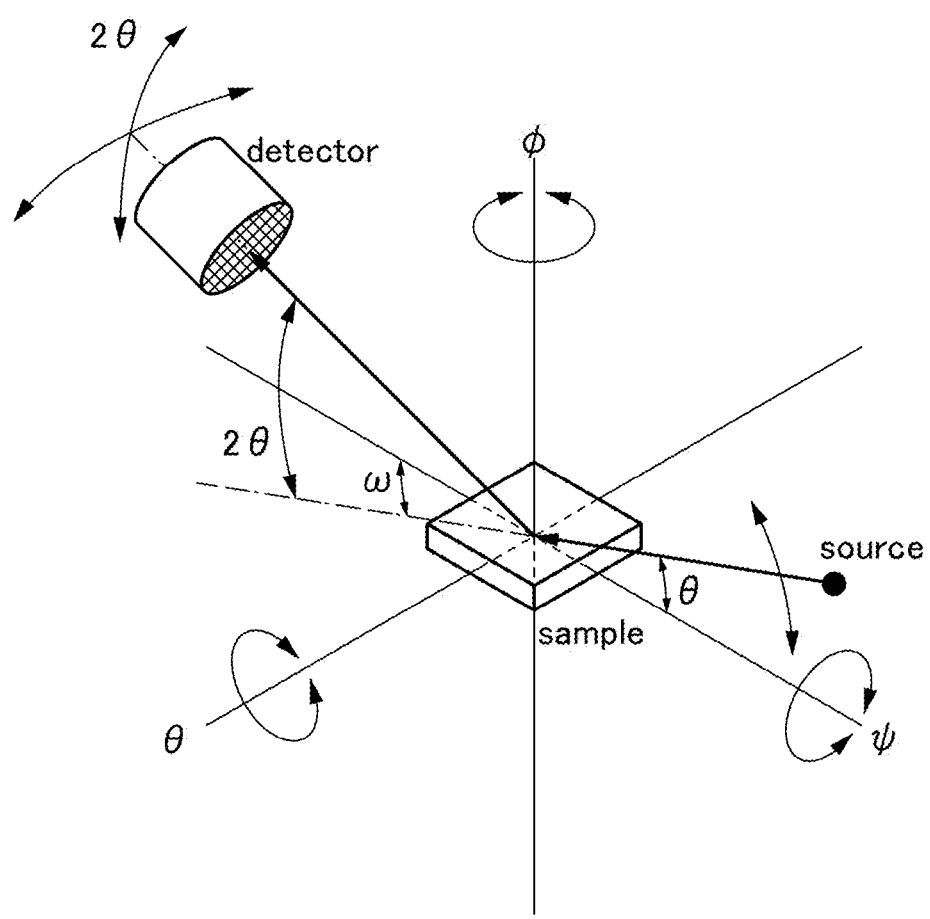
FIG. 4 is an experiment layout in wide-angle reciprocal space mapping and pole measurement.

Wide-angle reciprocal space mapping using an X-ray analysis apparatus is described with reference to FIG. 4. Here, as illustrated in FIG. 4, a direction in which an X-ray source (source), a sample, and a detector are arranged in line when the X-ray apparatus is seen from the above is referred to as a ψ axis. A direction perpendicular to the ψ axis when the X-ray analysis apparatus is seen from the above is referred to as a θ axis. A direction perpendicular to the ψ axis and the θ axis is referred to as a φ axis. That is, the φ axis is parallel to the direction in which the X-ray is seen from the above. Note that an axis that is referred to as the ψ axis in this specification is referred to as an χ axis depending on an apparatus in some cases. Therefore, the ψ axis can also be referred to as an χ axis. Similarly, an axis that is referred to as the θ axis in this specification is referred to as a ω axis depending on an apparatus in some cases. Thus, the θ axis can also be referred to as a ω axis.

A two-dimensional detector is used as the detector in the wide-angle reciprocal space mapping. The two-dimensional detector has positional information for 2θ and the ψ direction in the detection surface. Note that the detector illustrated in FIG. 4 is modeled on a two-dimensional detector.

As illustrated in FIG. 4, the wide-angle reciprocal space mapping is performed by operation of the sample and the detector when the X-ray source is fixed. Here, the detector can be tilted in a 2θ direction, and the sample can tilted in the θ direction, the φ direction, and the ψ direction. The wide-angle reciprocal space mapping is a measurement method in which a 2θ/θ scan is executed in each ψ position (angle) while the sample is tilted in the ψ direction in stages. Accordingly, a wide-angle reciprocal space map for a wide measurement area in the reciprocal space can be obtained. In the case where the X-ray source is a movable type, wide-angle reciprocal space mapping is performed by operation of the X-ray source, the sample, and the detector. Here, the X-ray source can be tilted in the θ direction. Note that unless otherwise specified, a CuKα ray (wavelength: 0.15418 nm) is used as the X-ray source in this specification.

To analyze intensity distribution that appears in the obtained wide-angle reciprocal space map, simulation of a wide-angle reciprocal space map is performed. For the simulation of a wide-angle reciprocal space map, software provided by Bruker Japan K.K., "SMAP/for Cross Sectional XRD-RSM", can be used, for example Parameters of a crystal structure, lattice constant, and orientation are input into the software, whereby a wide-angle reciprocal space map corresponding to the input values is output. The intensity distribution appearing in the wide-angle reciprocal space map obtained by the measurement can be analyzed by comparison of the wide-angle reciprocal space map output in the simulation with the wide-angle reciprocal space map obtained by the measurement.

In the case where the crystal structure of the metal oxynitride film is a wurtzite structure with a (001) orientation, spots corresponding to a reverse lattice point 002, a reverse lattice point 101, and the like are observed in the wide-angle reciprocal space map of the metal oxynitride film. Here, a peak of the spot corresponding to the reverse lattice point 002 is preferably positioned at an angle 2θ of greater than or equal to 30° and less than or equal to 35° and an angle ψ of around 0°. A peak of the spot corresponding to the reverse lattice point 101 is preferably positioned at an angle 2θ of greater than or equal to 33° and less than or equal to 37° and an angle ψ of greater than or equal to 61° and less than or equal to 65°. The half widths of the spots corresponding to the reverse lattice point 002 and the reverse lattice point 101 are preferably less than 2°. This can be one of indicators for determining that the metal oxynitride film is epitaxially grown so that the c-axis direction of the crystal included in the metal oxynitride film corresponds to the normal direction of the surface of the single crystal substrate.

<Pole Measurement>

Pole measurement is a method for measuring the distribution of diffraction intensity by rotating a sample in various directions with the positions (angles) of the X-ray source and the detector kept. A two-dimensional detector is used as the detector in the pole measurement in this specification. Specifically, the detector is fixed at a detection angle (2θ), and the sample, which is tilted in the θ direction and the ψ direction, is rotated in the in-plane direction (φ direction), thereby measuring lattice planes tilted in various directions. The crystallinity and orientation of the thin film can be evaluated from the diffraction intensity obtained by the pole measurement. Note that the detector used in the pole measurement is not limited to a two-dimensional detector and may be a zero-dimensional detector.

Figure 5A:
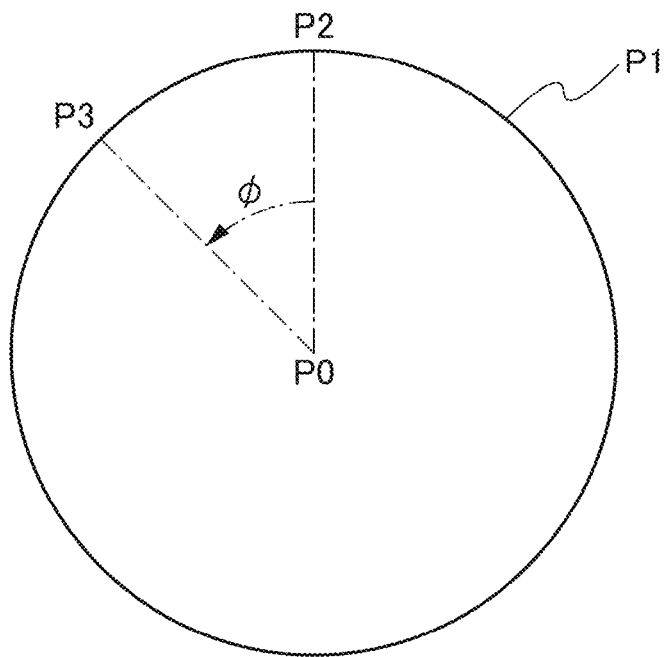
FIG. 5(A) is a diagram showing a pole figure.

The diffraction intensity obtained by the pole measurement is described with reference to FIG. 5(A) to FIG. 5(C). The diffraction intensity obtained by the pole measurement is shown by a pole figure. FIG. 5(A) shows a pole figure. As shown in FIG. 5(A), the center P0 of the pole figure has an angle ψ of 0°, and the outer periphery P1 of the pole figure has an angle ψ of 90°. A straight line that extends right above from the center P0 of the pole figure to the outer periphery P1 of the pole figure (a straight line dented by a dashed dotted line P0-P2 in FIG. 5(A)) has an angle φ of 0°, and an angle formed by the straight line and a straight line that extends from the center P0 of the pole figure to the outer periphery P1 of the pole figure (a straight line denoted by a dashed dotted line P0-P3 in FIG. 5(A)) becomes the angle φ. Although FIG. 5(A) shows that the angle φ increases in the case of counterclockwise rotation; however, it is not limited thereto, and the angle φ increases in the case of clockwise rotation in some cases depending on the apparatus or the like. In addition, the angle of the pole figure obtained by the pole measurement is not obtained in some case within a range of 0° to 90° depending on the range of a ψ scan.

Figure 5B:
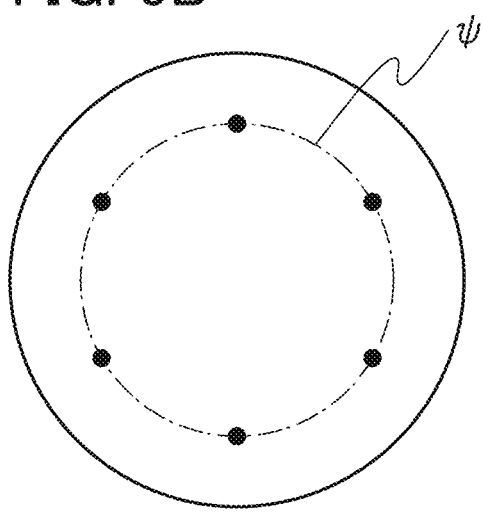
FIG. 5(B) and FIG. 5(C) are diagrams showing intensity distribution obtained in the pole measurement.
Figure 5C:
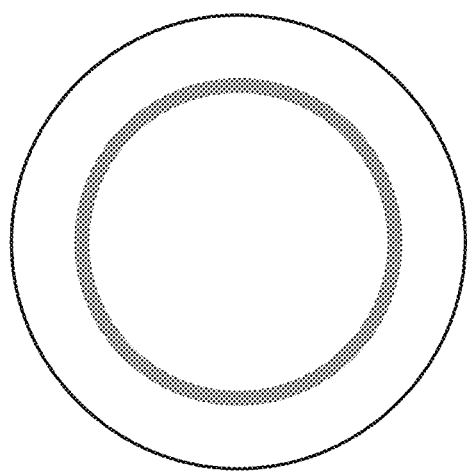

FIG. 5(B) and FIG. 5(C) are schematic diagrams of the diffraction intensity obtained by pole measurement. FIG. 5(B) is a schematic diagram of the diffraction intensity in the case where spot-like intensity distribution is observed on a concentric circle of the ψ angle (a circle denoted by a dashed dotted line in the figure), and FIG. 5(C) is a schematic diagram of the diffraction intensity in the case where a ring-like intensity distribution is observed.

For example, the (101) plane of the wurtzite structure has six-fold symmetry. In other words, when pole measurement is performed on a c-axis epitaxial film having a crystal with a wurtzite structure, spot-like intensity distribution (diffraction peak) is observed at six points on a concentric circle of a certain angle ψ, as shown in FIG. 5(B). Thus, in the case where a thin film having a crystal with a wurtzite structure is epitaxially grown along the c-axis, diffraction peaks indicating six-fold symmetry are observed in a φ scan on the (101) plane of the crystal of the thin film in pole measurement. Specifically, diffraction peaks are observed, at approximately every 60° with respect to the angle φ, on a concentric circle with an angle ψ of approximately 62°.

On the other hand, when pole measurement is performed on a thin film that is not epitaxially grown, ring-like intensity distribution as shown in FIG. 5(C) is observed, or no diffraction peak is observed. In this manner, the analysis on the intensity distribution observed in the pole measurement enables evaluation on whether the thin film is epitaxially grown.

Note that diffraction peaks indicating three-fold symmetry are observed in a φ scan for a (111) plane of a single crystal YSZ substrate in pole measurement. Specifically, diffraction peaks are observed, at approximately every 120° with respect to the angle φ, on a concentric circle with an angle ψ of approximately 70°. In addition, diffraction peaks indicating two-fold symmetry are observed in a φ scan for a (104) plane of a single crystal A-plane sapphire substrate in pole measurement. Specifically, diffraction peaks are observed, at approximately every 180° with respect to the angle φ, on a concentric circle with an angle ψ of approximately 58°.

<Out-of-Plane Measurement and In-Plane Measurement>

Out-of-plane measurement and in-plane measurement are given as measurement employing an XRD method. Out-of-plane measurement is a method for evaluating a crystal plane parallel to a surface of a thin film, and in-plane measurement is a method for evaluating a crystal plane perpendicular to a surface of a thin film. A zero-dimensional detector may be used as the detector in out-of-plane measurement and in-plane measurement.

The structure, method, and the like described above in this embodiment can be used in appropriate combination with structures, methods, and the like described in the other embodiments and the examples.

Embodiment 2

In this embodiment, application of the epitaxially grown metal oxynitride film described in the above embodiment will be described.

Examples of the application of the metal oxynitride film include a light-emitting element, a light-receiving element, and a semiconductor device. In particular, the metal oxynitride film can be used in a light-emitting element (also referred to as a light-emitting diode or an LED).

Structure examples of a light-emitting element including the metal oxynitride film are described with reference to FIG. 6(A) and FIG. 6(B). Note that in this embodiment, a light-emitting element having a double heterojunction is described. Note that one embodiment of the present invention is not limited thereto, and a light-emitting element having a quantum well junction may be used.

Figure 6A:
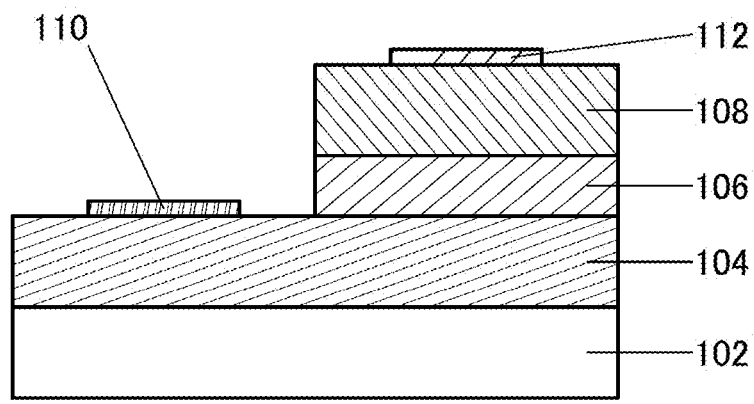
FIG. 6(A) and FIG. 6(B) are diagrams showing structure examples of a light-emitting element.
Figure 6B:
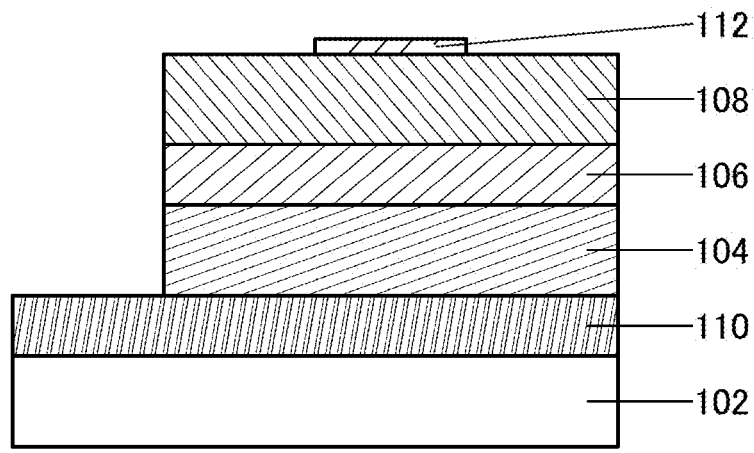

FIG. 6(A) and FIG. 6(B) each illustrate a light-emitting element 100 including the metal oxynitride film of one embodiment of the present invention. As illustrated in FIG. 6(A) and FIG. 6(B), the light-emitting element 100 includes a substrate 102, an n-type clad layer 104, an active layer 106, a p-type clad layer 108, an n-type electrode 110, and a p-type electrode 112.

The active layer 106 is sandwiched between the n-type clad layer 104 and the p-type clad layer 108. In the active layer 106, electrons and holes are combined to emit light. That is, the active layer 106 can be referred to as a light-emitting layer. A stacked-layer structure including the n-type clad layer 104, the active layer 106, and the p-type clad layer 108 is formed to emit light of red, yellow, green, blue, or the like. For example, for the stacked-layer structure, a compound of gallium and phosphorus, a compound of gallium and arsenic, a compound of gallium, aluminum, and arsenic, a compound of aluminum, gallium, indium, and phosphorus, gallium nitride, a compound of indium and gallium nitride, a compound of selenium and zinc, or the like can be used.

The atomic ratio of the metals included in the metal oxynitride film of one embodiment of the present invention, the flow rate of a nitrogen gas introduced to the reaction chamber at deposition, and the like are appropriately selected, whereby the conductivity (or insulating property), band gap, light-transmitting property, and the like of the metal oxynitride film can be adjusted. For example, as the flow rate of the nitrogen gas is increased, the conductivity of the film tends to increase. Accordingly, when the conductivity of the metal oxynitride film is adjusted, the metal oxynitride film can be used as the n-type clad layer 104 in FIG. 6(A) or the n-type electrode 110 in FIG. 6(B).

Note that the metal oxynitride film may be used as the n-type electrode 110 and the n-type clad layer 104 in FIG. 6(B). In the case where the metal oxynitride film is used as the n-type electrode 110 and the n-type clad layer 104 in FIG. 6(B), the metal oxynitride film is deposited while the flow rate of the nitrogen gas is adjusted, whereby the n-type electrode 110 and the n-type clad layer 104 in FIG. 6(B) can be deposited successively.

In addition, the metal oxynitride film can function as a buffer layer for making another thin film epitaxially grow on the film Thus, the crystallinity of the n-type clad layer 104 or the active layer 106 formed over the metal oxynitride film can be increased. Note that the crystal structure of the metal oxynitride film is a hexagonal system, particularly a wurtzite crystal structure. Therefore, a material forming a wurtzite crystal structure, such as gallium nitride or a compound of indium and gallium nitride, is preferably used for the n-type clad layer 104 or the active layer 106 formed over the metal oxynitride film.

Thus, the metal oxynitride film has a function of a base (buffer layer) for hexagonal-crystal growth and has a function of an n-type electrode or an n-type clad layer. When the metal oxynitride film is used as the n-type electrode 110 or the n-type clad layer 104, the n-type clad layer 104 or the active layer 106 is easily epitaxially grown, and the crystallinity of the n-type clad layer 104 or the active layer 106 is increased. Accordingly, the characteristics of the light-emitting element, such as the light emission efficiency and durability life, can be improved.

This embodiment can be combined with any of the other embodiments or examples as appropriate.

Embodiment 3

In this embodiment, examples in which the light-emitting element of one embodiment of the present invention is used in various lighting devices will be described with reference to FIG. 7(A) and FIG. 7(B). With the use of the light-emitting element of one embodiment of the present invention, a lighting device having high light emission efficiency and high reliability can be manufactured.

Figure 7A:
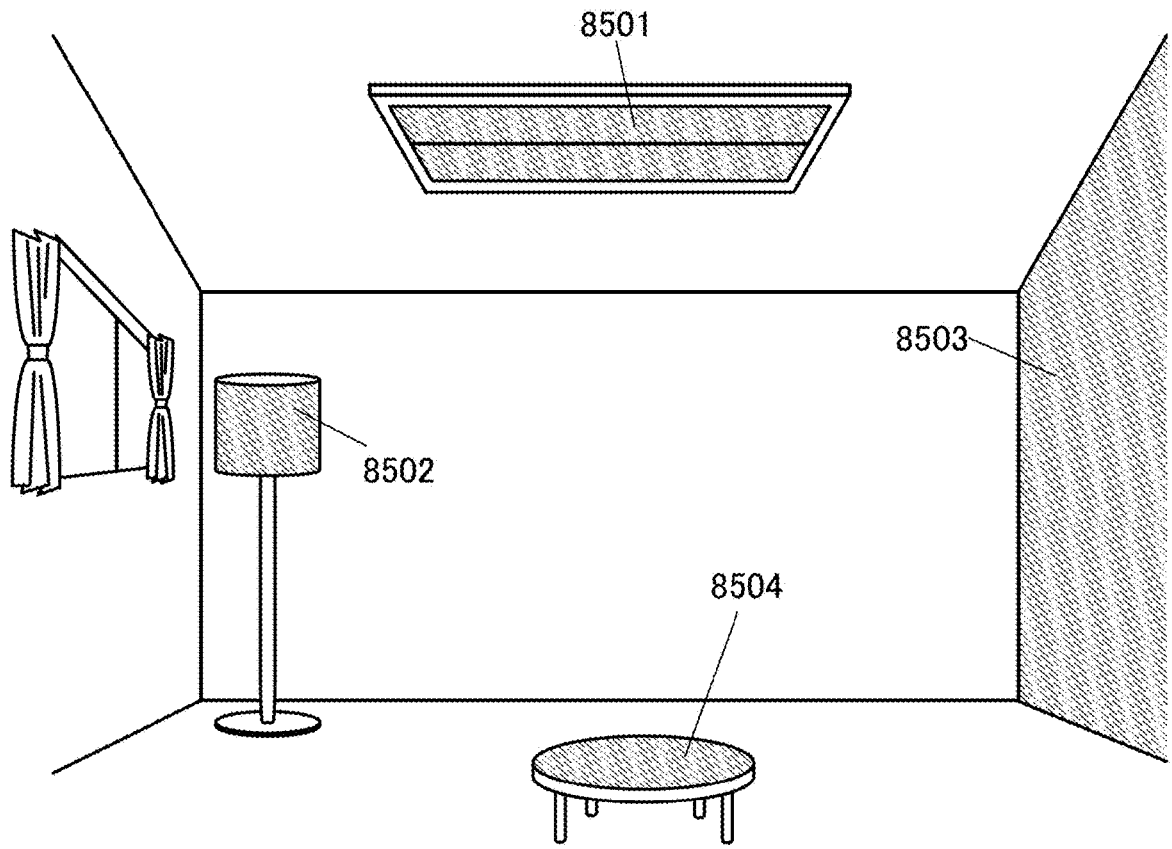
FIG. 7(A) and FIG. 7(B) are diagrams showing lighting devices of one embodiment of the present invention.

FIG. 7(A) is an example in which the light-emitting element is used for an indoor lighting device. The use of a plurality of light-emitting elements enables formation of a large-area lighting device 8501 and a lighting device 8502 having a curved surface. Furthermore, a wall of the room may be provided with a large-sized lighting device 8503. The lighting device 8501, the lighting device 8502, and the lighting device 8503 may be provided with touch sensors with which power is turned on or off.

When the light-emitting element is used on the surface side of a table, a lighting device 8504 that has a function of a table can be obtained. When the light-emitting element is used as part of other furniture, a lighting device having a function of the furniture can be obtained.

Furthermore, a light-emitting device in which the light-emitting element of one embodiment of the present invention is used can also be used for lighting for automobiles; for example, such lighting can be provided on a dashboard, a windshield, a ceiling, and the like.

Figure 7B:
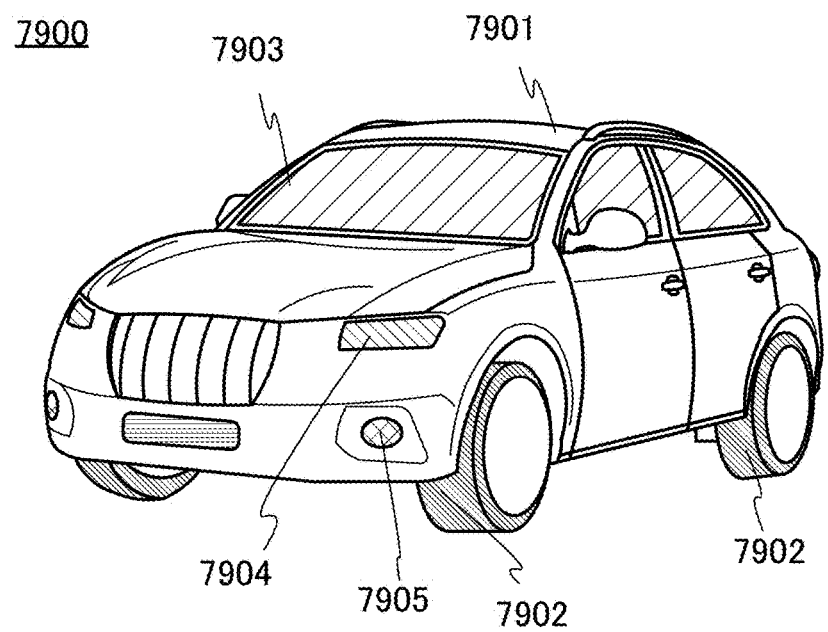

FIG. 7(B) is an external view of an automobile 7900. The automobile 7900 includes a car body 7901, wheels 7902, a windshield 7903, lights 7904, fog lamps 7905, and the like. The light-emitting element of one embodiment of the present invention can be used in the lights 7904 and the fog lamps 7905 illustrated in FIG. 7(B), for example Although not illustrated, the light-emitting element of one embodiment of the present invention can be used in side blinkers, back lamps, and door courtesy lamps, for example.

As described above, lighting devices can be obtained by application of the light-emitting element of one embodiment of the present invention. Note that the applicable lighting device can be used for lighting apparatuses in a variety of fields without being limited to that described in this embodiment.

The structure described above in this embodiment can be used in combination as appropriate with any of the structures described in the other embodiments and an example.

Embodiment 4

In this embodiment, structure examples of a display device including the light-emitting element described in the above embodiment are described with reference to FIG. 8(A) to FIG. 8(C).

The display device of this embodiment has a function of displaying an image with the use of a light-emitting element. In this embodiment, in particular, an example where a micro light-emitting diode (hereinafter, also referred to as a micro LED) is used as the light-emitting element is described.

When a micro LED is used as the display element, the power consumption of the display device can be reduced. Furthermore, the display device can be thinner and more lightweight. Moreover, the display device including the micro LED as the display element have high contrast and a wide viewing angle; thus, the display quality can be improved.

The area of a light-emitting region of a micro LED is preferably less than or equal to 1 mm$^2$, further preferably less than or equal to 10000 μm$^2$, still further preferably less than or equal to 3000 μm$^2$, even further preferably less than or equal to 700 μm$^2$.

Figure 8A:
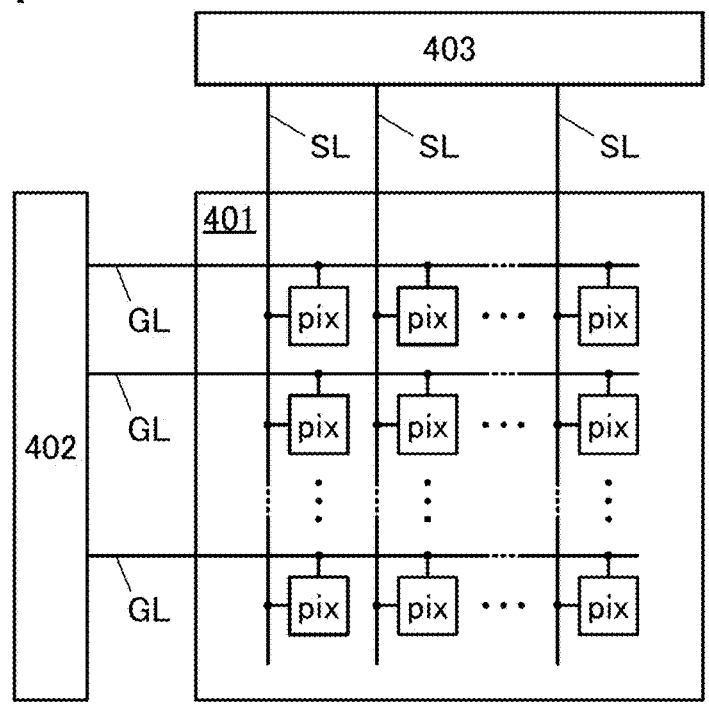
FIG. 8(A) to FIG. 8(C) are diagrams showing structure examples of a display device.

FIG. 8(A) illustrates a structure example of a display device 400 including a light-emitting element. The display device 400 includes a pixel unit 401, a driver circuit 402, and a driver circuit 403.

The pixel unit 401 includes a plurality of pixels pix. The pixels pix are connected to wirings SL and wirings GL. The wirings GL are each connected to the driver circuit 402, and the wirings SL are each connected to the driver circuit 403. Selection signals are supplied to the wirings GL, and image signals are supplied to the wirings SL.

The driver circuit 402 has a function of supplying selection signals to the pixels pix. Specifically, the driver circuit 402 has a function of supplying selection signals to the wirings GL, and the wirings GL have a function of transmitting the selection signals output from the driver circuit 402 to the pixels pix. Note that the driver circuit 402 can be referred to as a gate side driver circuit or a gate driver, and the wirings GL can also be referred to as selection signal lines, gate lines, or the like.

The driver circuit 403 has a function of supplying image signals to the pixels pix. Specifically, the driver circuit 403 has a function of supplying image signals to the wirings SL, and the wirings SL have a function of transmitting the image signals output from the driver circuit 403 to the pixels pix. Note that the driver circuit 403 can be referred to as a source side driver circuit or a source driver, and the wirings SL can also be referred to as image signal lines, source lines, or the like.

Figure 8B:
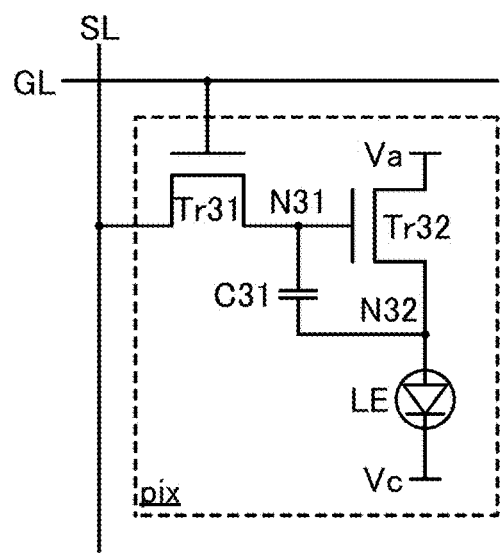

FIG. 8(B) illustrates a structure example of the pixel pix including a light-emitting element as a display element. The pixel pix illustrated in FIG. 8(B) includes a transistor Tr31, a transistor Tr32, a capacitor C31, and a light-emitting element LE. Note that although the transistor Tr31 and the transistor Tr32 are of n-channel type here, the polarities of the transistors can be changed as appropriate. The light-emitting element described in the above embodiment can be used as the light-emitting element LE.

A gate of the transistor Tr31 is connected to the wiring GL, one of a source and a drain is connected to a gate of the transistor Tr32 and one electrode of the capacitor C31, and the other of the source and the drain is connected to the wiring SL. One of a source and a drain of the transistor Tr32 is connected to the other electrode of the capacitor C31 and one electrode of the light-emitting element LE, and the other of the source and the drain is connected to a wiring to which a potential Va is supplied. The other electrode of the light-emitting element LE is connected to a wiring to which a potential Vc is supplied. A node that is connected to the one of the source and the drain of the transistor Tr31, the gate of the transistor Tr32, and the one electrode of the capacitor C31 is referred to as a node N31. A node that is connected to the one of the source and the drain of the transistor Tr32, the other electrode of the capacitor C31, and the one electrode of the light-emitting element LE is referred to as a node N32.

Here, the case where the potential Va is a high power supply potential and the potential Vc is a low power supply potential is described. The potential Va and the potential Vc can each be a common potential to the plurality of pixels pix. Furthermore, the capacitor C31 functions as a storage capacitor for retaining the potential of the node N31.

The transistor Tr31 has a function of controlling the supply of the potential of the wiring SL to the node N31. Specifically, the potential of the wiring GL is controlled to turn on the transistor Tr31, whereby the potential of the wiring SL that corresponds to an image signal is supplied to the node N31 and written to the pixel pix. After that, the potential of the wiring GL is controlled to turn off the transistor Tr31, whereby the potential of the node N31 is retained.

Then, the amount of current flowing between the source and the drain of the transistor Tr32 is controlled in accordance with the voltage between the node N31 and the node N32, and the light-emitting element LE emits light with a luminance corresponding to the amount of flowing current. Accordingly, the gray level of the pixel pix can be controlled. Note that the transistor Tr32 preferably operates in a saturation region.

Here, the transistor Tr31 and the transistor Tr32 may be provided in the same layer or may be stacked. When the transistor Tr31 and the transistor Tr32 are provided in the same layer, the transistor Tr31 and the transistor Tr32 can be manufactured at the same time, so that the manufacturing process of the display device can be shortened. On the other hand, when the transistor Tr31 and the transistor Tr32 are stacked, the integration degree of the display device can be increased.

As illustrated in FIG. 8(B), the pixel pix preferably includes two transistors (Tr31 and Tr32). Note that one embodiment of the present invention is not limited thereto, and three or more transistors may be provided in the pixel pix.

Figure 8C:
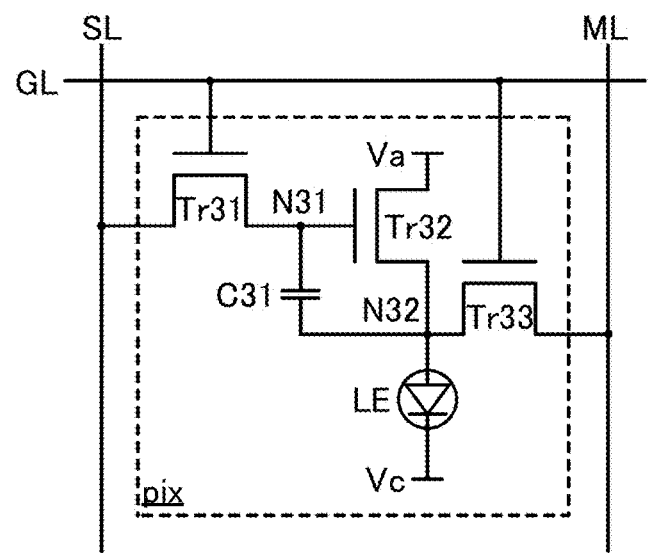

FIG. 8(C) illustrates a structure example of the pixel pix including a light-emitting element as a display element, which is different from that in FIG. 8(B). The pixel pix in FIG. 8(C) includes the transistor Tr31, the transistor Tr32, a transistor Tr33, the capacitor C31, and the light-emitting element LE. That is, the pixel pix in FIG. 8(C) is a pixel in which the transistor Tr33 for monitoring the amount of current flowing through the transistor Tr32 is added to the pixel pix in FIG. 8(B).

The gate of the transistor Tr31 is connected to the wiring GL, one of the source and the drain is connected to the gate of the transistor Tr32 and one electrode of the capacitor C31, and the other of the source and the drain is connected to the wiring SL. One of the source and the drain of the transistor Tr32 is connected to the other electrode of the capacitor C31, one electrode of the light-emitting element LE, and one of a source and a drain of the transistor Tr33, and the other of the source and the drain is connected to a wiring to which the potential Va is supplied. The other electrode of the light-emitting element LE is connected to a wiring to which the potential Vc is supplied. A gate of the transistor Tr33 is connected to the wiring GL, and the other of the source and the drain is connected to a monitoring line ML. A node that is connected to the one of the source and the drain of the transistor Tr31, the gate of the transistor Tr32, and the one electrode of the capacitor C31 is referred to as the node N31. A node that is connected to the one of the source and the drain of the transistor Tr32, the other electrode of the capacitor C31, the one electrode of the light-emitting element LE, and one of the source and the drain of the transistor Tr33 is referred to as the node N32.

The above-described operation is sequentially performed for every wiring GL, whereby an image for a first frame can be displayed.

Note that the selection of the wirings GL may be performed by either a progressive method or an interlaced method. In addition, the supply of image signals to the wirings SL may be performed by dot sequential driving in which image signals are sequentially supplied to the wirings SL, or may be performed by line sequential driving in which image signals are concurrently supplied to all the wirings SL. Alternatively, the image signals may be sequentially supplied to every set of wirings SL.

Next, in a second frame period, an image is displayed by an operation similar to the first frame period. Thus, the image displayed on the pixel unit 401 is rewritten.

As a semiconductor used for the transistors included in the pixels pix, a Group 14 element such as silicon or germanium, a compound semiconductor such as gallium arsenide, an organic semiconductor, a metal oxide, or the like can be used. The semiconductor may be a non-single-crystal semiconductor (e.g., an amorphous semiconductor, a microcrystalline semiconductor, or a polycrystalline semiconductor) or a single crystal semiconductor.

Here, the transistors included in the pixels pix preferably contain an amorphous semiconductor, in particular, hydrogenated amorphous silicon (a-Si:H) in channel formation regions. Transistors using an amorphous semiconductor easily deal with the increase in substrate area; thus, when a large-screen display device that is compatible with 4K2K broadcasting or 8K4K broadcasting, for example, is manufactured, the manufacturing process can be simplified.

Furthermore, a transistor including a metal oxide in a channel formation region (an OS transistor) can be used as each of the transistors included in the pixels pix. An OS transistor has higher field-effect mobility than a transistor including hydrogenated amorphous silicon. In addition, an OS transistor does not require a crystallization process that has been necessary for a transistor using polycrystalline silicon or the like.

Since an OS transistor has an extremely low off-state current, in the case where an OS transistor is used as the transistor Tr31, an image signal can be retained in the pixel pix for an extremely long period. This enables the update frequency of an image signal to be extremely low in a period when there is no change in the image displayed on the pixel unit 401 or a period when the change is at a certain level or lower. The update frequency of an image signal can be set less than or equal to once every 0.1 seconds, less than or equal to once every second, or less than or equal to once every 10 seconds, for example In particular, when a large number of pixels pix are provided to be compatible with 4K2K broadcasting or 8K4K broadcasting, or the like, reducing the power consumption by skipping update of an image signal is effective.

This embodiment can be combined with the descriptions of the other embodiments and an example as appropriate.

Embodiment 5

In this embodiment, electronic devices of one embodiment of the present invention that include the display device described in the above embodiment will be described with reference to drawings.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device of one embodiment of the present invention may include an antenna. When a signal is received by the antenna, the electronic device can display an image, data, or the like on the display unit. Note that since the display unit can be formed using the display device, the display unit can also be referred to as a display device. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

Figure 9A:
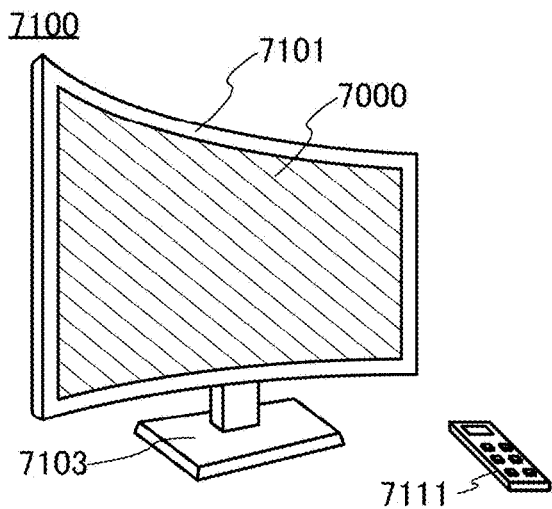
FIG. 9(A) to FIG. 9(E) are diagrams showing structure examples of electronic devices.

The electronic device of one embodiment of the present invention can have a variety of functions. For example, it can have a function of displaying a variety of information (a still image, a moving image, a text image, and the like) on the display unit, a touch panel function, a function of displaying a calendar, date, time, and the like, a function of executing a variety of software (programs), a wireless communication function, and a function of reading out a program or data stored in a recording medium FIG. 9(A) illustrates an example of a television device. In a television device 7100, a display unit 7000 is incorporated in a housing 7101. Here, a structure in which the housing 7101 is supported by a stand 7103 is illustrated.

The display device of one embodiment of the present invention can be used in the display unit 7000.

The television device 7100 illustrated in FIG. 9(A) can be operated with an operation switch provided in the housing 7101 or a separate remote controller 7111. Alternatively, the display unit 7000 may include a touch sensor, and the television device 7100 can be operated by touch on the display unit 7000 with a finger, a stylus, or the like. The remote controller 7111 may be provided with a display unit for displaying information output from the remote controller 7111. With operation keys or a touch panel provided in the remote controller 7111, channels and volume can be operated and images displayed on the display unit 7000 can be operated.

Note that the television device 7100 is provided with a receiver, a modem, and the like. A general television broadcast can be received with the receiver. Furthermore, when the television device is connected to a communication network with or without wires via the modem, one-way (from a transmitter to a receiver) or two-way (between a transmitter and a receiver or between receivers, for example) data communication can be performed.

Figure 9B:
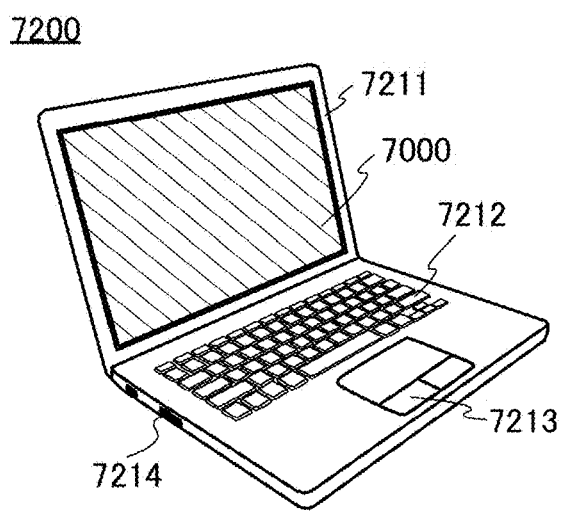

FIG. 9(B) illustrates a laptop personal computer 7200. The laptop personal computer 7200 includes a housing 7211, a keyboard 7212, a pointing device 7213, an external connection port 7214, and the like. In the housing 7211, the display unit 7000 is incorporated.

The display device of one embodiment of the present invention can be used as the display unit 7000.

Figure 9C:
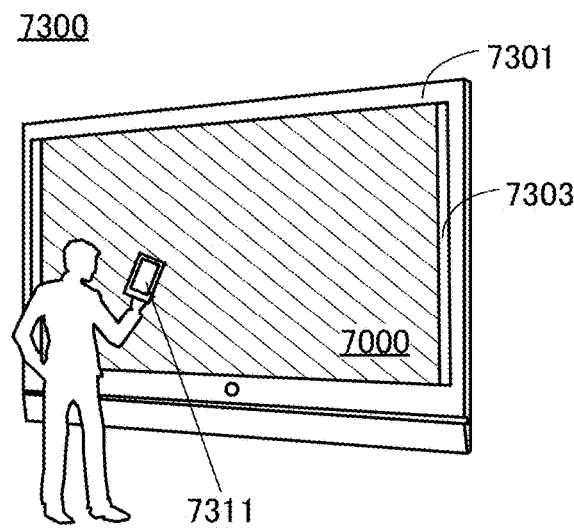
Figure 9D:
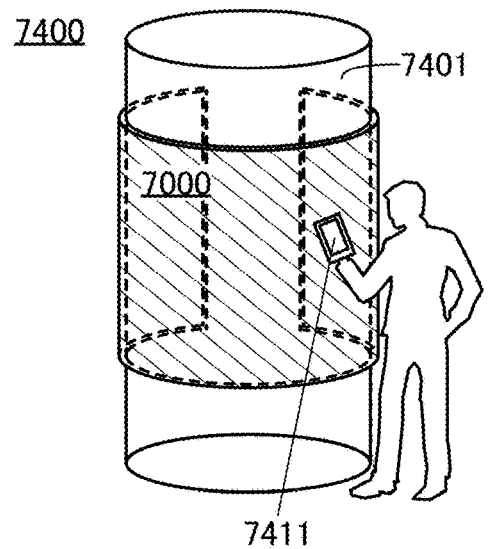

FIGS. 9(C) and 9(D) illustrate examples of digital signage.

Digital signage 7300 illustrated in FIG. 9(C) includes a housing 7301, the display unit 7000, a speaker 7303, and the like. Furthermore, the digital signage can include an LED lamp, operation keys (including a power switch or an operation switch), a connection terminal, a variety of sensors, a microphone, and the like.

In addition, FIG. 9(D) is digital signage 7400 attached to a cylindrical pillar 7401. The digital signage 7400 includes the display unit 7000 provided along a curved surface of the pillar 7401.

The display device of one embodiment of the present invention can be used in the display unit 7000 in FIGS. 9(C) and 9(D).

A larger area of the display unit 7000 can increase the amount of information that can be provided at a time. In addition, the larger display unit 7000 attracts more attention, so that the effectiveness of the advertisement can be increased, for example.

It is preferable to use a touch panel for the display unit 7000 because not only an image or a moving image is displayed on the display unit 7000 but also users can operate intuitively. Moreover, for an application for providing information such as route information or traffic information, usability can be enhanced by intuitive operation.

Furthermore, as illustrated in FIGS. 9(C) and 9(D), it is preferable that the digital signage 7300 or the digital signage 7400 work with an information terminal 7311 or an information terminal 7411 such as a user's smartphone through wireless communication. For example, information of an advertisement displayed on the display unit 7000 can be displayed on a screen of the information terminal 7311 or the information terminal 7411. Moreover, by operation of the information terminal 7311 or the information terminal 7411, display on the display unit 7000 can be switched.

Furthermore, it is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 9E:
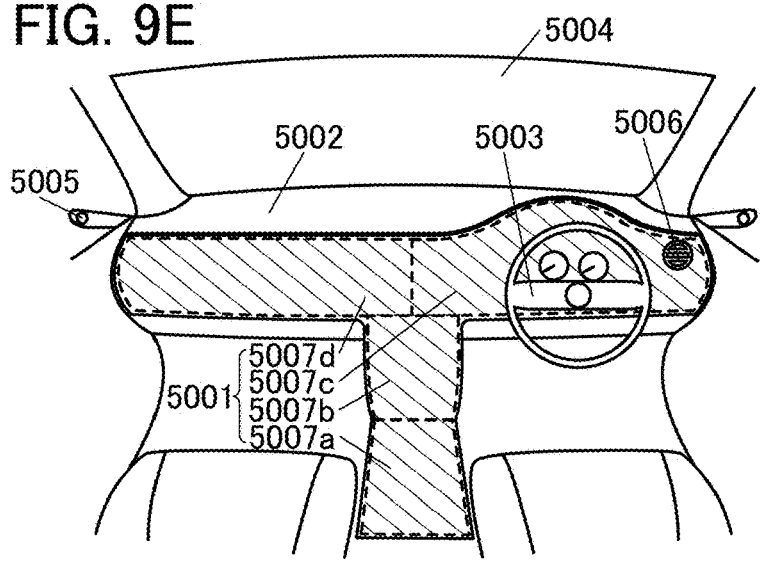

The display device of one embodiment of the present invention can be incorporated along a curved surface of an inside wall or an outside wall of a house or a building or the interior or the exterior of a vehicle. FIG. 9(E) illustrates an example of installation of the display device of one embodiment of the present invention in a vehicle.

FIG. 9(E) illustrates a structure example of a vehicle equipped with a display unit 5001. As the display unit 5001, the display device of one embodiment of the present invention can be used. Note that although in the example illustrated in FIG. 9(E), the display unit 5001 is installed in, but not limited to, a right-hand drive vehicle; installation in a left-hand drive vehicle is possible. In that case, the left and right of the arrangement shown in FIG. 9(E) are reversed.

FIG. 9(E) illustrates a dashboard 5002, a steering wheel 5003, a windshield 5004, and the like that are arranged around a driver's seat and a front passenger's seat. The display unit 5001 is placed in a predetermined position in the dashboard 5002, specifically, around the driver, and has a rough T shape. Although one display unit 5001 formed of a plurality of display panels 5007 (display panels 5007a, 5007b, 5007c, and 5007d) is provided along the dashboard 5002 in the example illustrated in FIG. 9(E), the display unit 5001 may be divided and placed in a plurality of places.

Note that the plurality of display panels 5007 may have flexibility. In this case, the display unit 5001 can be processed into a complicated shape; for example, a structure in which the display unit 5001 is provided along a curved surface of the dashboard 5002 or the like or a structure in which a display region of the display unit 5001 is not provided at a connection portion of the steering wheel, display units of meters, a ventilation duct 5006, or the like can easily be achieved.

In addition, a plurality of cameras 5005 that take pictures of the situations at the rear side may be provided outside the vehicle. Although the camera 5005 is provided instead of a side mirror in the example in FIG. 9(E), both the side mirror and the camera may be provided.

As the camera 5005, a CCD camera, a CMOS camera, or the like can be used. In addition, an infrared camera may be used in combination with such a camera. The infrared camera, which has a higher output level with a higher temperature of an object, can detect or extract a living body such as a human or an animal.

An image captured with the camera 5005 can be output to any one or more of the display panels 5007a, 5007b, 5007c, and 5007d. This display unit 5001 is mainly used for supporting driving of the vehicle. An image of the situation on the rear side is taken at a wide angle of view by the camera 5005, and the image is displayed on the display panels 5007 so that the driver can see a blind area for avoiding an accident.

Furthermore, a distance image sensor may be provided over a roof of the vehicle, for example, and an image obtained by the distance image sensor may be displayed on the display unit 5001. For the distance image sensor, an image sensor, LIDAR (Light Detection and Ranging), or the like can be used. An image obtained by the image sensor and the image obtained by the distance image sensor are displayed on the display unit 5001, whereby more information can be provided to the driver to support driving.

The display unit 5001 may also have a function of displaying map information, traffic information, television images, DVD images, and the like. For example, map information can be displayed on the display panels 5007a, 5007b, 5007c, and 5007d as a large display screen. Note that the number of display panels 5007 can be increased depending on the image to be displayed.

Furthermore, the images displayed on the display panels 5007a, 5007b, 5007c, and 5007d can be freely set to meet the driver's preference. For example, television images or DVD images are displayed on the display panel 5007d on the left, map information is displayed on the display panel 5007b at the center position, meters are displayed on the display panel 5007c on the right, and audio information and the like are displayed on the display panel 5007a near a transmission gear (between the driver's seat and the front passenger's seat). In addition, a combination of the plurality of display panels 5007 can add a fail-safe function to the display unit 5001. For example, even when any one of the display panels 5007 is broken for any reason, a display region can be changed so that display can be performed using another display panel 5007.

This embodiment can be combined with the descriptions of the other embodiments and an example as appropriate.

EXAMPLE

In this example, evaluation results of the crystallinity and orientation of a metal oxynitride film formed by the method described in the above embodiment are described. Specifically, a plurality of samples (Sample 1 to Sample 7) in each of which a metal oxynitride film was deposited on a substrate by the method described in the above embodiment were prepared, and wide-angle reciprocal space mapping, pole measurement, out-of-plane measurement, in-plane measurement, and the like were performed on each sample.

<Method for Manufacturing Samples>

First, a method for manufacturing Sample 1 to Sample 7 will be described.

Sample 1 to Sample 7 were manufactured by the method for manufacturing a metal oxynitride film described in Embodiment 1. Specifically, a single crystal substrate was prepared, and a metal oxynitride film was deposited on the substrate by a sputtering method using an oxide target with a gas introduced into a reaction chamber. Note that before the metal oxynitride film is deposited on the substrate, pretreatment such as air annealing or vacuum annealing is not performed on the substrate. In addition, heat treatment is not performed on the deposited metal oxynitride film.

As the deposition conditions of the metal oxynitride film common to Sample 1 to Sample 7, the deposition pressure was set to 0.4 Pa, the deposition power was set to 200 W, and the distance between the oxide target and the substrate was set to 130 mm.

The single crystal substrates used in manufacture of the samples are described. For Sample 1 to Sample 6, yttria-stabilized zirconia (YSZ) substrates were prepared as the single crystal substrates. The plane orientation of the YSZ substrates is (111). For Sample 7, an A-plane sapphire substrate was prepared as the single crystal substrate. The plane orientation of the A-plane sapphire substrate is (110).

Next, the oxide targets used for manufacture of the samples are described. In—Ga—Zn oxide targets with In:Ga:Zn=4:2:4.1 [atomic ratio] were used as the oxide targets for Sample 1, Sample 5, Sample 6, and Sample 7. Thus, the metal oxynitride films of Sample 1, Sample 5, Sample 6, and Sample 7 are In—Ga—Zn oxynitride films. An In—Zn oxide target with In:Zn=2:1 [atomic ratio] was used as the oxide target for Sample 2. Thus, the metal oxynitride film of Sample 2 is an In—Zn oxynitride film. Zinc oxide was used as the oxide target for Sample 3. Thus, the metal oxynitride film of Sample 3 is a zinc oxynitride film. An In—Ga—Zn oxide target with In:Ga:Zn=1:1:1 [atomic ratio] was used as the oxide target for Sample 4. Thus, the metal oxynitride film of Sample 4 is an In—Ga—Zn oxynitride film.

Next, the gas introduced into the reaction chamber (also referred to as a deposition gas) is described. A nitrogen gas ($N_2$) at 45 sccm was used as the deposition gas for Sample 1, Sample 2, Sample 3, Sample 4, Sample 6, and Sample 7. A mixed gas of a nitrogen gas ($N_2$) at 45 sccm and an argon gas (Ar) at 45 sccm was used as the deposition gas for Sample 5.

Next, a substrate temperature during deposition of the metal oxynitride film is described. The substrate temperatures for Sample 1, Sample 2, Sample 3, Sample 4, Sample 5, and Sample 7 were set to 200° C. The substrate temperature for Sample 6 was set to 100° C.

Sample 1 to Sample 7 were manufactured as described above. Table 1 summarizes the processing conditions of the samples.

TABLE 1

| Sample | Single crystal substrate | Oxide target | Gas flow rate | Substrate temperature |
|---|---|---|---|---|
| 1 | YSZ substrate | In—Ga—Zn oxide (In:Ga:Zn = 4:2:4.1 [atomic ratio]) | N2 = 45 sccm | 200° C. |
| 2 | | In—Zn oxide (In:Zn = 2:1 [atomic ratio]) | | |
| 3 | | Zinc oxide | | |
| 4 | | In—Ga—Zn oxide (In:Ga:Zn = 1:1:1 [atomic ratio]) | | |
| 5 | | In—Ga—Zn oxide (In:Ga:Zn = 4:2:4.1 [atomic ratio]) | N2 = 45 sccm, Ar = 45 sccm | |
| 6 | | | | N2 = 45 sccm | 100° C. |
| 7 | A-plane sapphire substrate | | | 200° C. |

Wide-angle reciprocal space mapping, pole measurement, out-of-plane measurement, in-plane measurement, and the like were performed on each of Sample 1 to Sample 7 that were manufactured. An X-ray diffraction apparatus, D8 DOSCOVER, manufactured by Bruker Japan K.K. was used as an apparatus for wide-angle reciprocal space mapping, pole measurement, out-of-plane measurement, and in-plane measurement; as for the detector, VÅNTEC-500 two-dimensional detector was used for wide-angle reciprocal space mapping and pole measurement, and a zero-dimensional detector was used for out-of-plane measurement and in-plane measurement. As described later, out-of-plane measurement and in-plane measurement are performed in order to mainly estimate a lattice constant used as an input value for simulation of a wide-angle reciprocal space map. Therefore, illustration and the like of the results of out-of-plane measurement and in-plane measurement are omitted in this example.

In wide-angle reciprocal space mapping, the two-dimensional detector ("detector" in FIG. 4) covers the angle 2θ at a time, and measurement was performed by a scan of the angle θ at each angle ψ. Specifically, the distance between the sample ("sample" in FIG. 4) and the two-dimensional detector ("detector" in FIG. 4) was set to approximately 150 mm In addition, the angle 2θ was set to 40° and a range in which the angle 2θ fell within 20° to 60° was recorded at a time. In addition, a scan of an angle θ was performed in the range of 10° to 30°. The angle ψ was in the range of 0° to 85° in steps of 5° (18 steps in total). An incident X-ray diameter was set to 0.3 mmφ with a collimator, a CuKα ray (wavelength: 0.15418 nm) was used as the X-ray source, and an output of an X-ray was set to 50 kV and 100 mA. An X-ray exposure time per step was set to 60 seconds. Wide-angle reciprocal space mapping was performed on each sample to obtain a wide-angle reciprocal space map of each sample. Note that in each diagram showing the wide-angle reciprocal space map, the horizontal axis represents the angle 2θ [°], and the vertical axis represents the angle ψ [°]. In addition, the intensity at each point in the wide-angle reciprocal space map corresponds to a bar on the right side of the wide-angle reciprocal space map. Specifically, the higher the intensity is, the blacker (darker) the color becomes; the lower the intensity is, the whiter (paler) the color becomes.

For the simulation of the wide-angle reciprocal space map corresponding to each sample, software provided by Bruker Japan K.K., "SMAP/for Cross Sectional XRD-RSM", was used. Note that the crystal structure of the metal oxynitride included in each sample was assumed to be a wurtzite structure, and the lattice constant was set to a lattice constant estimated from the out-of-plane measurement, the in-plane measurement, and scan results of the other reciprocal lattice points. When wide-angle reciprocal space maps of crystal structures that have the same symmetry (or space group) and different lattice constants are compared with each other, the positions (the angle 2θ and the angle ψ) of peaks of spots appearing in the maps are observed to be shifted in some cases.

Note that all the spots that can be observed in the crystal assumed in the simulation are shown in the wide-angle reciprocal space map obtained by the simulation. Accordingly, the crystal orientation of in-plane orientation may differ between the wide-angle reciprocal space map of the epitaxially grown thin film and the wide-angle reciprocal space map obtained by the simulation depending on the angle φ, and thus, observed spots may be different.

In this example, the angle φ is adjusted when the wide-angle reciprocal space mapping is performed in order that the crystal plane corresponding to the reciprocal lattice point observed in the wide-angle reciprocal space map correspond to the crystal plane observed in pole measurement. Specifically, in the cases of Sample 1 to Sample 6, the angle φ is preferably adjusted when the wide-angle reciprocal space mapping is performed so that the (101) plane of the metal oxynitride film of each sample and the (111) plane of the substrate included in each sample are observed in the wide-angle reciprocal space map at the same time. In the case of Sample 7, the angle φ is preferably adjusted when the wide-angle reciprocal space mapping is performed so that the (101) plane of the metal oxynitride film of Sample 7 and the (104) plane of the substrate included in Sample 7 are observed in the in the wide-angle reciprocal space map at the same time.

Results of the pole measurement shown in this example are represented by pole figures.

<Evaluation of Sample 1>

Figure 10B:
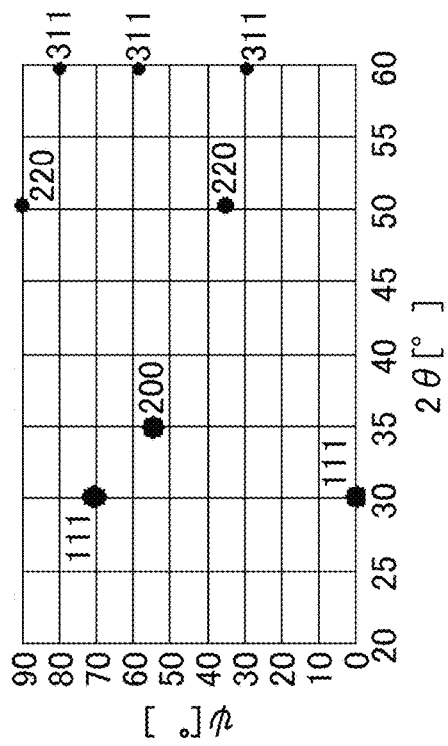
FIG. 10(B) and FIG. 10(C) are diagrams showing wide-angle reciprocal space maps obtained by simulation.
Figure 10C:
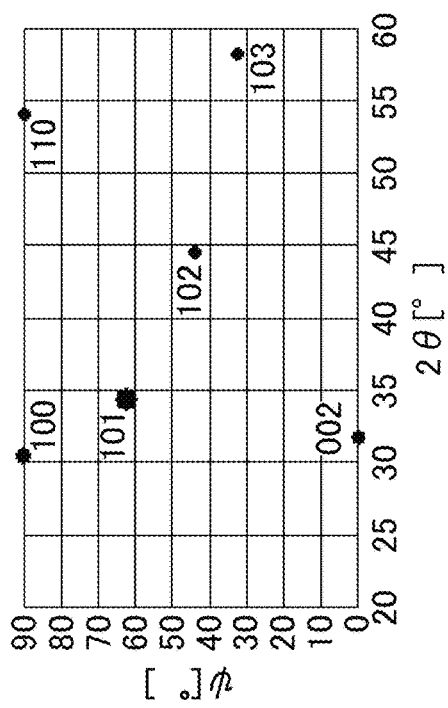
Figure 10A:
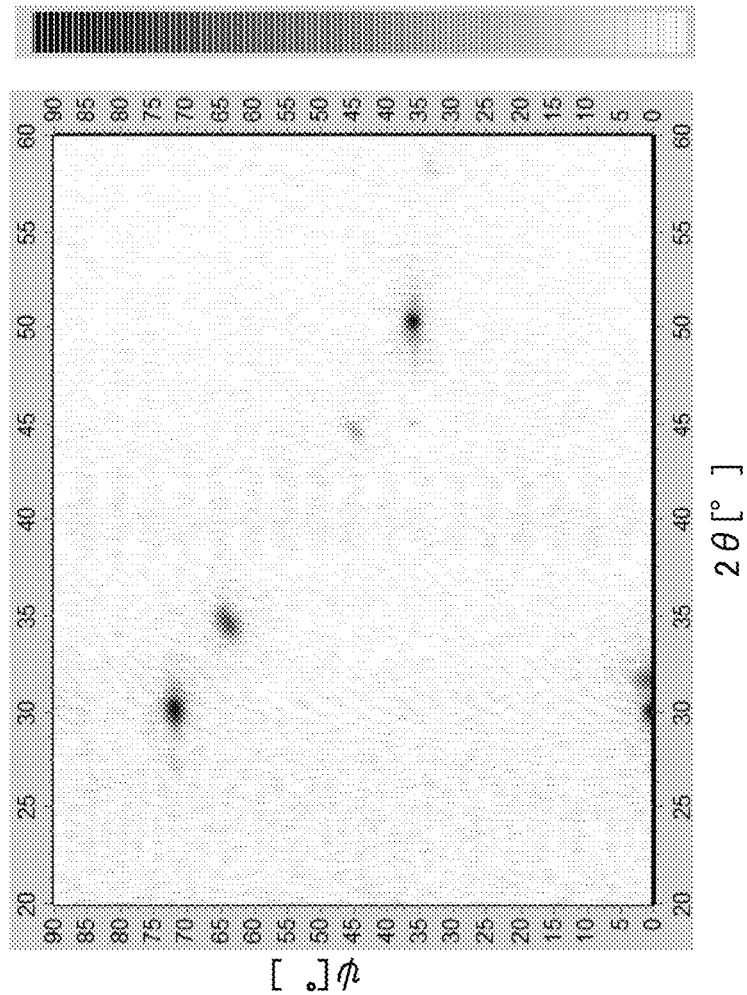
FIG. 10(A) is a diagram showing a wide-angle reciprocal space map of Sample 1 of Example

FIG. 10(A) shows a wide-angle reciprocal space map of Sample 1. FIG. 10(B) and FIG. 10(C) show wide-angle reciprocal space maps obtained by simulation. FIG. 10(B) is a wide-angle reciprocal space map corresponding to the single crystal substrate of Sample 1, and FIG. 10(C) is a wide-angle reciprocal space map corresponding to the crystal included in the metal oxynitride film of Sample 1.

A plurality of spots were observed in FIG. 10(A). Comparison between the plurality of observed spots and spots shown in FIG. 10(B) and FIG. 10(C) indicates that the spot with a peak positioned at an angle 2θ of approximately 35° and an angle ψ of approximately 62° corresponds to the (101) plane of the wurtzite structure, and the spot with a peak positioned at an angle 2θ of approximately 44° and an angle ψ of approximately 44° corresponds to the (102) plane of the wurtzite structure.

Figure 11A:
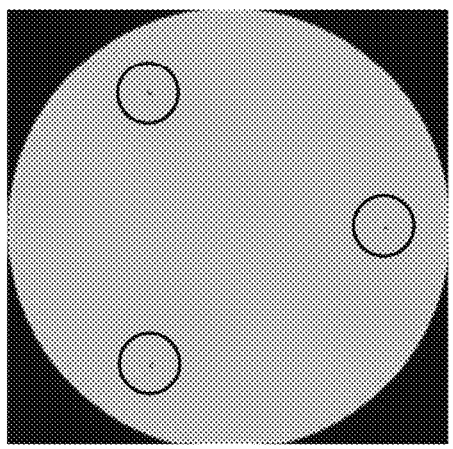
FIG. 11(A) and FIG. 11(B) are diagrams showing results of pole measurement on Sample 1 of Example.
Figure 11B:
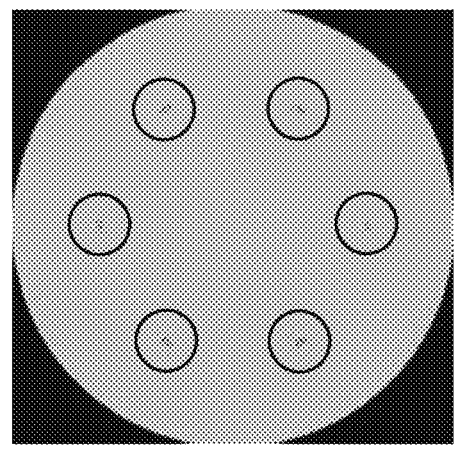

Next, FIG. 11(A) and FIG. 11(B) show results of the pole measurement on Sample 1. FIG. 11(A) shows a result for the (111) plane of the single crystal substrate of Sample 1, and FIG. 11(B) shows a result for the (101) plane of the metal oxynitride film of Sample 1.

As shown by solid-line circles in FIG. 11(A), spot-like intensity distribution was observed at three points on a concentric circle with an angle ψ of approximately 70°. The spots are three-fold symmetry spots derived from the (111) plane of yttria-stabilized zirconia (YSZ). In addition, as shown by solid-line circles in FIG. 11(B), spot-like intensity distribution was observed at six points on a concentric circle with an angle ψ of approximately 62°. In other words, the (101) plane of the metal oxynitride film of Sample 1 has six-fold symmetry, showing that the metal oxynitride film of Sample 1 has in-plane orientation. In addition, an angle formed by the (002) plane and the (101) plane of the wurtzite structure is approximately 62°, which indicates that the crystal included in the metal oxynitride film of Sample 1 has a wurtzite structure. Furthermore, it is found from FIG. 11(A) and FIG. 11(B) that the metal oxide film of Sample 1 is a c-axis epitaxial film that does not have domains in which the crystal orientation is rotated in the film plane.

The above shows that the metal oxynitride film of Sample 1 has a wurtzite structure and is epitaxially grown.

<Evaluation of Sample 2>

Figure 12A:
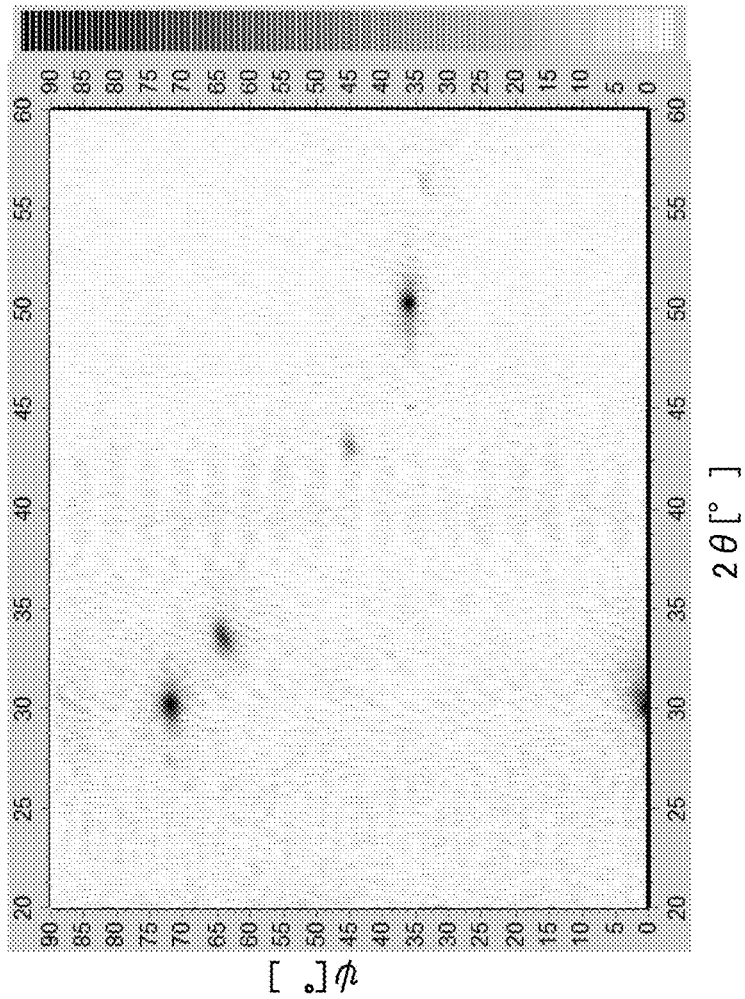
FIG. 12(A) is a diagram showing a wide-angle reciprocal space map of Sample 2 of Example
Figure 12B:
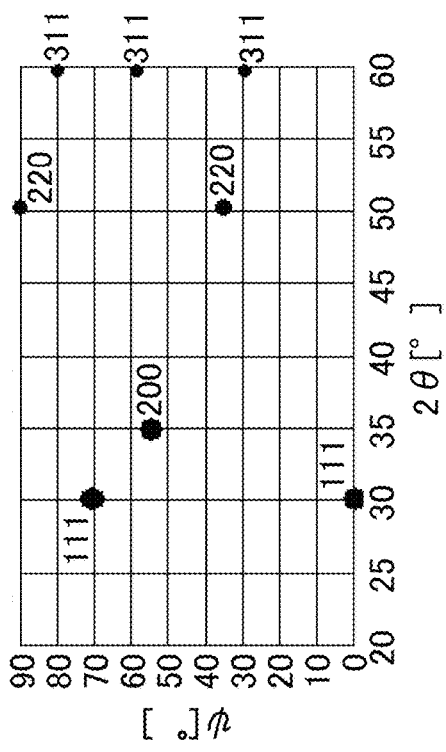
FIG. 12(B) and FIG. 12(C) are diagrams showing wide-angle reciprocal space maps obtained by simulation.
Figure 12C:
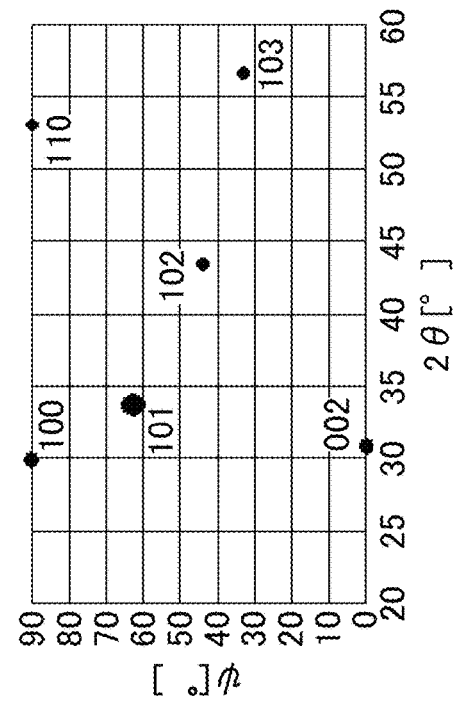

FIG. 12(A) shows a wide-angle reciprocal space map of Sample 2. FIG. 12(B) and FIG. 12(C) show wide-angle reciprocal space maps obtained by simulation. FIG. 12(B) is a wide-angle reciprocal space map corresponding to the single crystal substrate of Sample 2, and FIG. 12(C) is a wide-angle reciprocal space map corresponding to the crystal included in the metal oxynitride film of Sample 2.

Figure 13A:
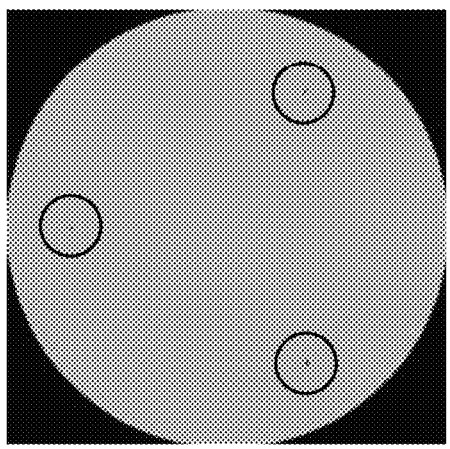
FIG. 13(A) and FIG. 13(B) are diagrams showing results of pole measurement on Sample 2 of Example.
Figure 13B:
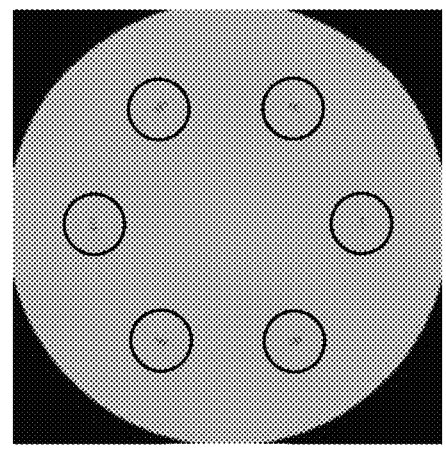

A plurality of spots were observed in FIG. 12(A). Comparison between the plurality of observed spots and spots shown in FIG. 12(B) and FIG. 12(C) indicates that the spot with a peak positioned at an angle 2θ of approximately 34° and an angle ψ of approximately 62° corresponds to the (101) plane of the wurtzite structure, and the spot with a peak positioned at an angle 2θ of approximately 44° and an angle ψ of approximately 44° corresponds to the (102) plane of the wurtzite structure Next, FIG. 13(A) and FIG. 13(B) show results of the pole measurement on Sample 2. FIG. 13(A) shows a result for the (111) plane of the single crystal substrate of Sample 2, and FIG. 13(B) shows a result for the (101) plane of the metal oxynitride film of Sample 2.

As shown by solid-line circles in FIG. 13(A), spot-like intensity distribution was observed at three points on a concentric circle with an angle ψ of approximately 70°. In addition, as shown by solid-line circles in FIG. 13(B), spot-like intensity distribution was observed at six points on a concentric circle with an angle ψ of approximately 62°. In other words, the (101) plane of the metal oxynitride film of Sample 2 has six-fold symmetry, showing that the metal oxynitride film of Sample 2 has in-plane orientation. In addition, an angle formed by the (002) plane and the (101) plane of the wurtzite structure is approximately 62°, which indicates that the crystal included in the metal oxynitride film of Sample 2 has a wurtzite structure. Furthermore, it is found from FIG. 13(A) and FIG. 13(B) that the metal oxide film of Sample 2 is a c-axis epitaxial film that does not have domains in which the crystal orientation is rotated in the film plane.

The above shows that the metal oxynitride film of Sample 2 has a wurtzite structure and is epitaxially grown.

<Evaluation of Sample 3>

Figure 14B:
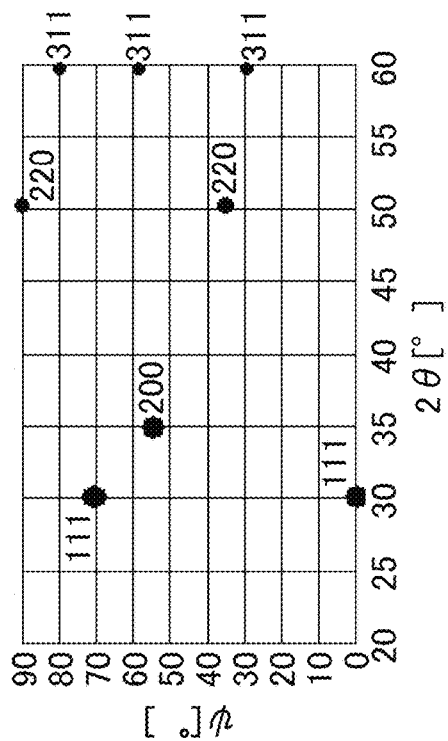
FIG. 14(B) and FIG. 14(C) are diagrams showing wide-angle reciprocal space maps obtained by simulation.
Figure 14C:
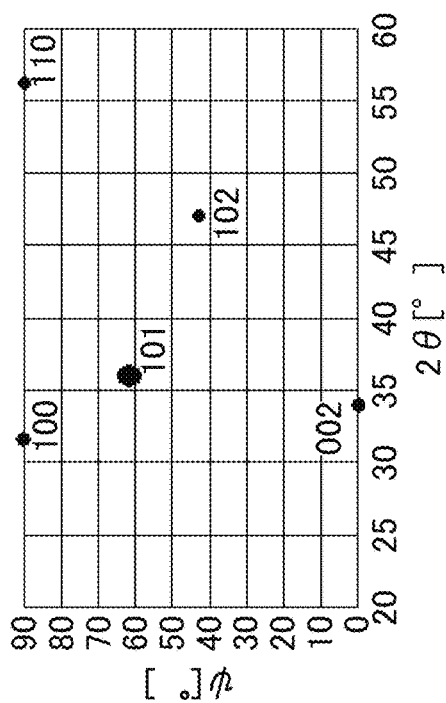
Figure 14A:
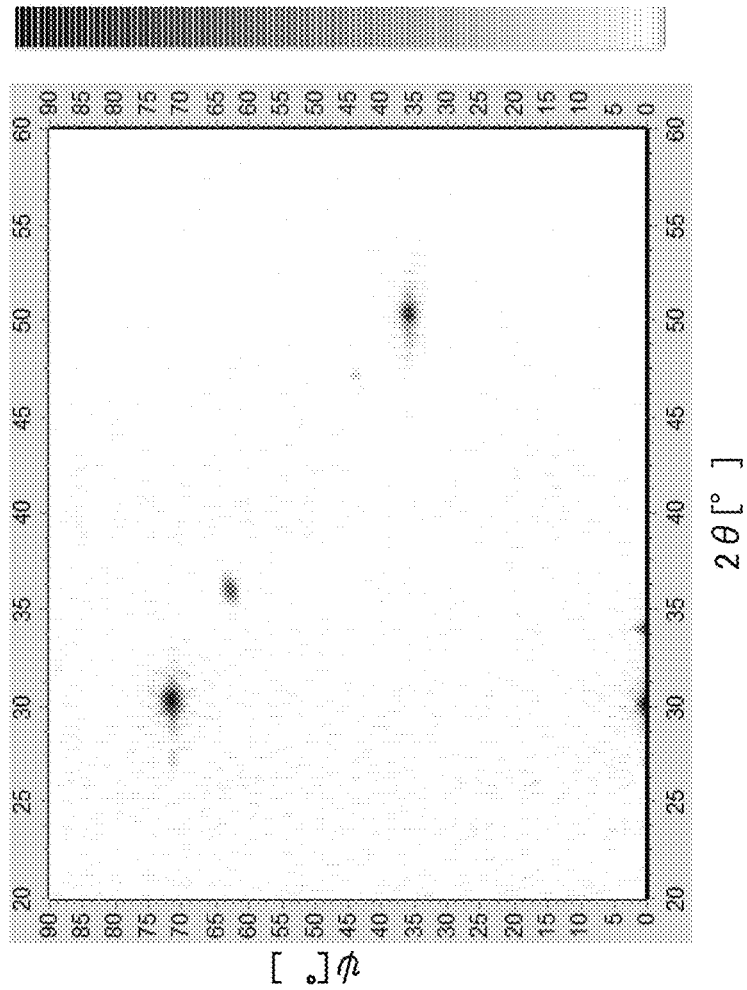
FIG. 14(A) is a diagram showing a wide-angle reciprocal space map of Sample 3 of Example

FIG. 14(A) shows a wide-angle reciprocal space map of Sample 3. FIG. 14(B) and FIG. 14(C) show wide-angle reciprocal space maps obtained by simulation. FIG. 14(B) is a wide-angle reciprocal space map corresponding to the single crystal substrate of Sample 3, and FIG. 14(C) is a wide-angle reciprocal space map corresponding to the crystal included in the metal oxynitride film of Sample 3.

A plurality of spots were observed in FIG. 14(A). Comparison between the plurality of observed spots and spots shown in FIG. 14(B) and FIG. 14(C) indicates that the spot with a peak positioned at an angle 2θ of approximately 36° and an angle ψ of approximately 62° corresponds to the (101) plane of the wurtzite structure, and the spot with a peak positioned at an angle 2θ of approximately 47° and an angle ψ of approximately 42° corresponds to the (102) plane of the wurtzite structure.

Figure 15A:
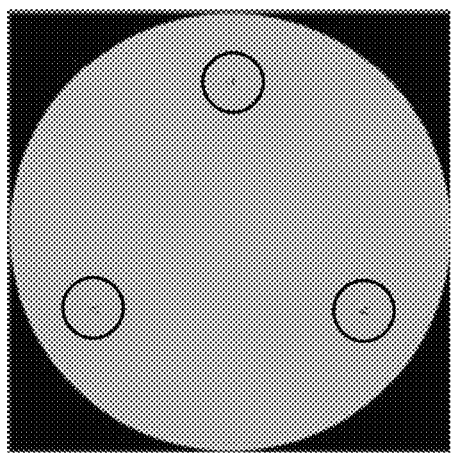
FIG. 15(A) and FIG. 15(B) are diagrams showing results of pole measurement on Sample 3 of Example.
Figure 15B:
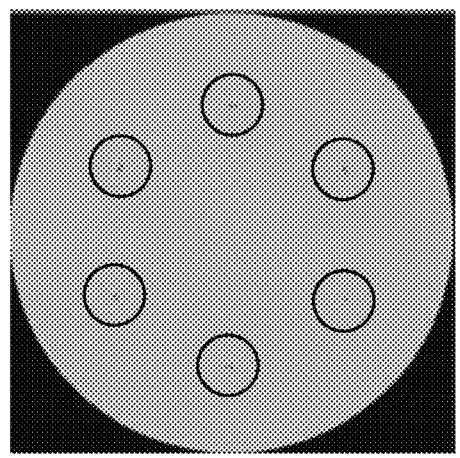

Next, FIG. 15(A) and FIG. 15(B) show results of the pole measurement on Sample 3. FIG. 15(A) shows a result for the (111) plane of the single crystal substrate of Sample 3, and FIG. 15(B) shows a result for the (101) plane of the metal oxynitride film of Sample 3.

As shown by solid-line circles in FIG. 15(A), spot-like intensity distribution was observed at three points on a concentric circle with an angle ψ of approximately 70°. In addition, as shown by solid-line circles in FIG. 15(B), spot-like intensity distribution was observed at six points on a concentric circle with an angle ψ of approximately 62°. In other words, the (101) plane of the metal oxynitride film of Sample 3 has six-fold symmetry, showing that the metal oxynitride film of Sample 3 has in-plane orientation. In addition, an angle formed by the (002) plane and the (101) plane of the wurtzite structure is approximately 62°, which indicates that the crystal included in the metal oxynitride film of Sample 3 has a wurtzite structure. Furthermore, it is found from FIG. 15(A) and FIG. 15(B) that the metal oxide film of Sample 3 is a c-axis epitaxial film that does not have domains in which the crystal orientation is rotated in the film plane.

The above shows that the metal oxynitride film of Sample 3 has a wurtzite structure and is epitaxially grown.

<Evaluation of Sample 4>

Figure 16B:
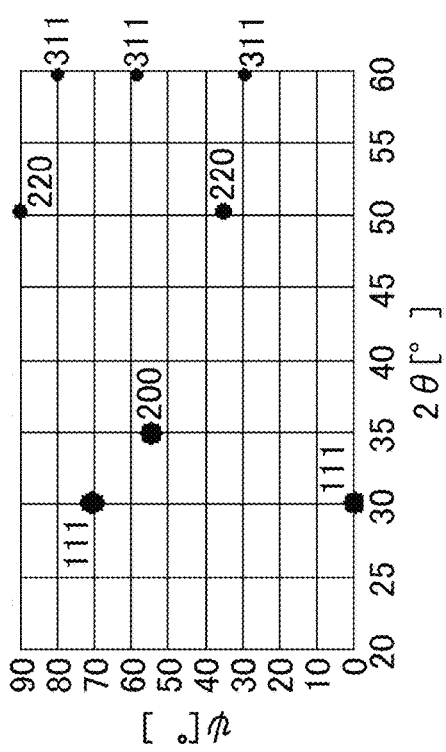
FIG. 16(B) and FIG. 16(C) are diagrams showing wide-angle reciprocal space maps obtained by simulation.
Figure 16C:
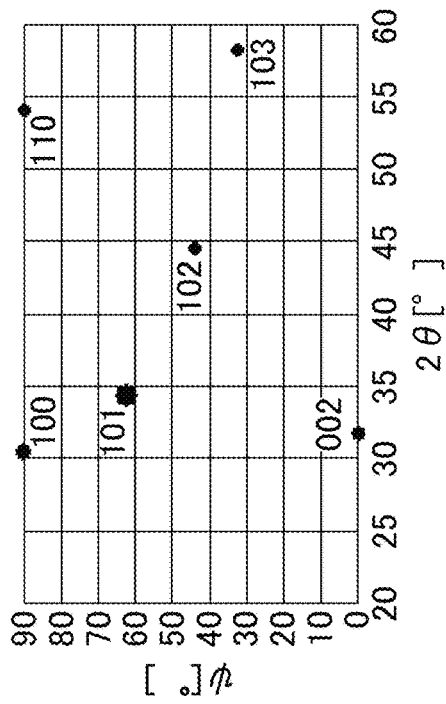
Figure 16A:
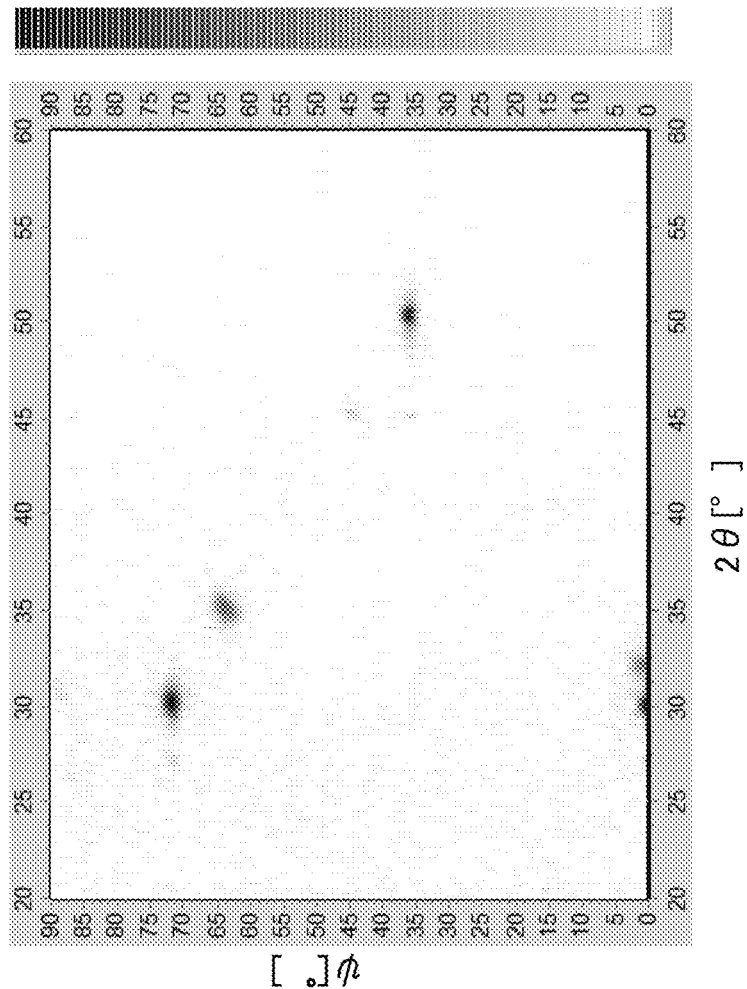
FIG. 16(A) is a diagram showing a wide-angle reciprocal space map of Sample 4 of Example

FIG. 16(A) shows a wide-angle reciprocal space map of Sample 4. FIG. 16(B) and FIG. 16(C) show wide-angle reciprocal space maps obtained by simulation. FIG. 16(B) is a wide-angle reciprocal space map corresponding to the single crystal substrate of Sample 4, and FIG. 16(C) is a wide-angle reciprocal space map corresponding to the crystal included in the metal oxynitride film of Sample 4.

A plurality of spots were observed in FIG. 16(A). Comparison between the plurality of observed spots and spots shown in FIG. 16(B) and FIG. 16(C) indicates that the spot with a peak positioned at an angle 2θ of approximately 35° and an angle ψ of approximately 62° corresponds to the (101) plane of the wurtzite structure, and the spot with a peak positioned at an angle 2θ of approximately 44° and an angle ψ of approximately 44° corresponds to the (102) plane of the wurtzite structure.

Figure 17A:
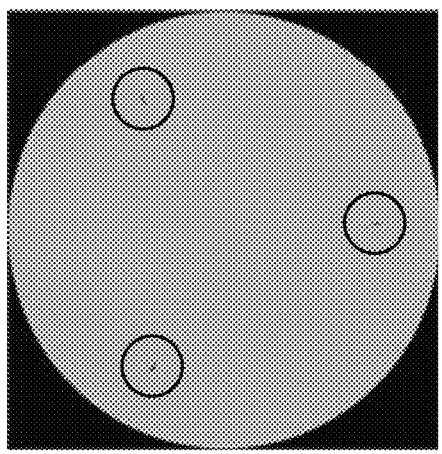
FIG. 17(A) and FIG. 17(B) are diagrams showing results of pole measurement on Sample 4 of Example.
Figure 17B:
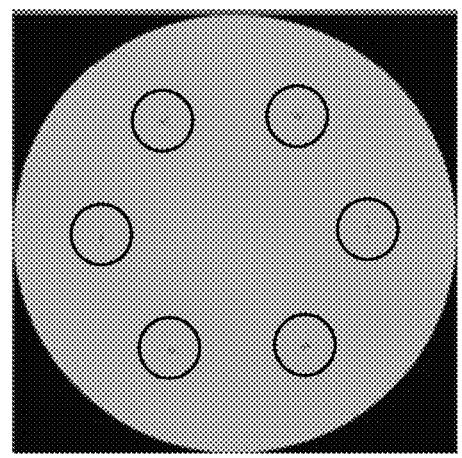

Next, FIG. 17(A) and FIG. 17(B) show results of the pole measurement on Sample 4. FIG. 17(A) shows a result for the (111) plane of the single crystal substrate of Sample 4, and FIG. 17(B) shows a result for the (101) plane of the metal oxynitride film of Sample 4.

As shown by solid-line circles in FIG. 17(A), spot-like intensity distribution was observed at three points on a concentric circle with an angle ψ of approximately 70°. In addition, as shown by solid-line circles in FIG. 17(B), spot-like intensity distribution was observed at six points on a concentric circle with an angle ψ of approximately 62°. In other words, the (101) plane of the metal oxynitride film of Sample 4 has six-fold symmetry, showing that the metal oxynitride film of Sample 4 has in-plane orientation. In addition, an angle formed by the (002) plane and the (101) plane of the wurtzite structure is approximately 62°, which indicates that the crystal included in the metal oxynitride film of Sample 4 has a wurtzite structure. Furthermore, it is found from FIG. 17(A) and FIG. 17(B) that the metal oxide film of Sample 4 is a c-axis epitaxial film that does not have domains in which the crystal orientation is rotated in the film plane.

The above shows that the metal oxynitride film of Sample 4 has a wurtzite structure and is epitaxially grown.

<Evaluation of Sample 5>

Figure 18B:
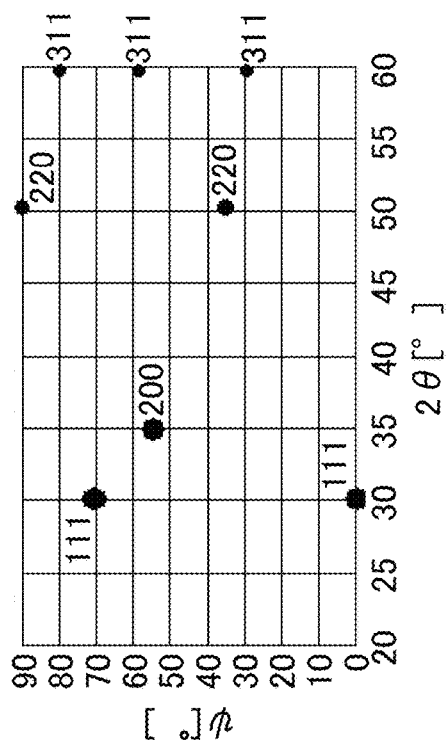
FIG. 18(B) and FIG. 18(C) are diagrams showing wide-angle reciprocal space maps obtained by simulation.
Figure 18C:
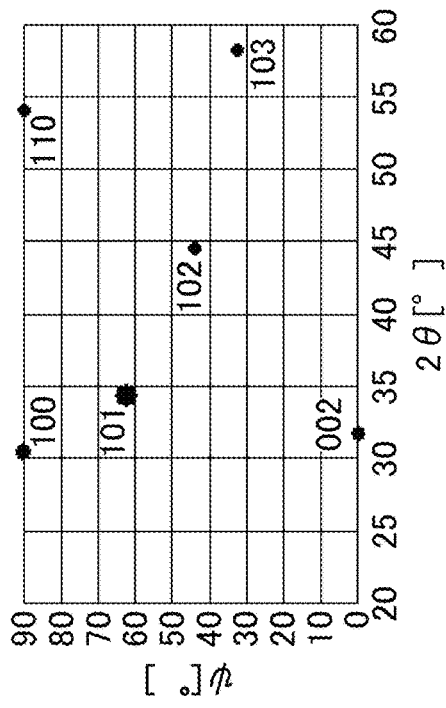
Figure 18A:
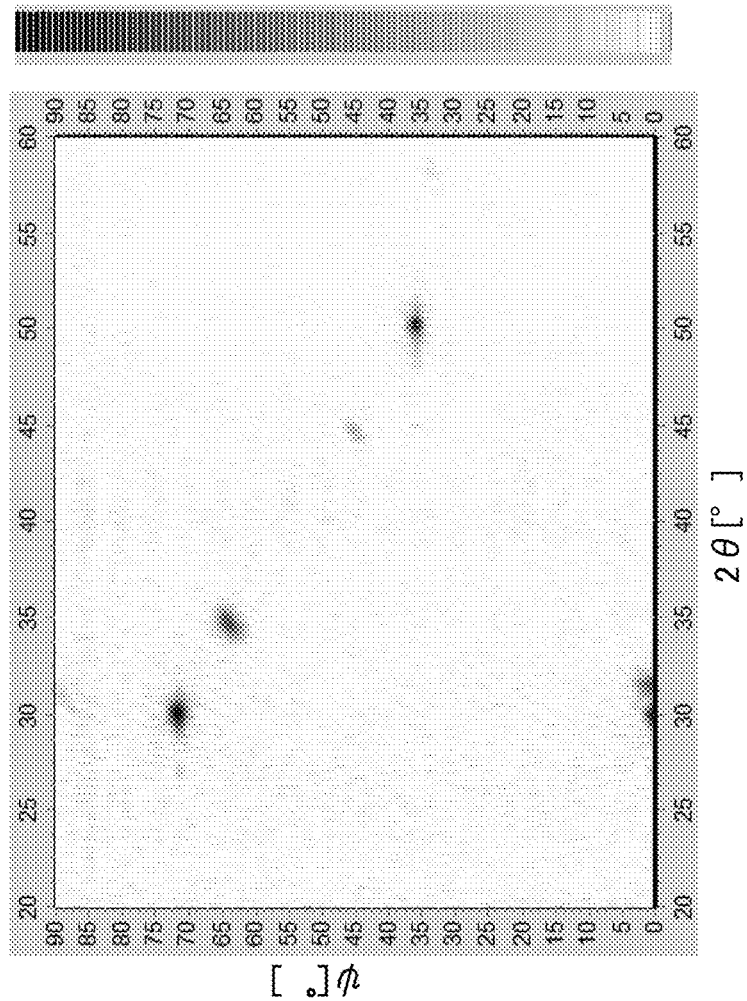
FIG. 18(A) is a diagram showing a wide-angle reciprocal space map of Sample 5 of Example

FIG. 18(A) shows a wide-angle reciprocal space map of Sample 5. FIG. 18(B) and FIG. 18(C) show wide-angle reciprocal space maps obtained by simulation. FIG. 18(B) is a wide-angle reciprocal space map corresponding to the single crystal substrate of Sample 5, and FIG. 18(C) is a wide-angle reciprocal space map corresponding to the crystal included in the metal oxynitride film of Sample 5.

A plurality of spots were observed in FIG. 18(A). Comparison between the plurality of observed spots and spots shown in FIG. 18(B) and FIG. 18(C) indicates that the spot with a peak positioned at an angle 2θ of approximately 35° and an angle ψ of approximately 62° corresponds to the (101) plane of the wurtzite structure, and the spot with a peak positioned at an angle 2θ of approximately 44° and an angle ψ of approximately 44° corresponds to the (102) plane of the wurtzite structure.

Figure 19A:
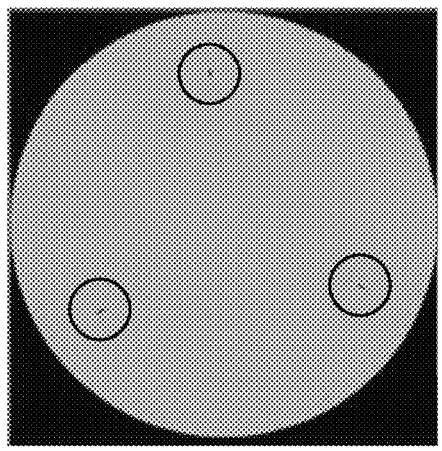
FIG. 19(A) and FIG. 19(B) are diagrams showing results of pole measurement on Sample of Example.
Figure 19B:
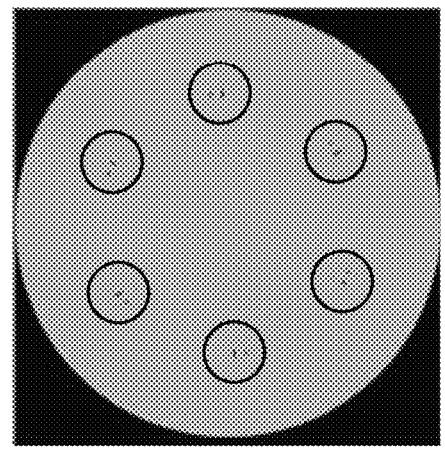

Next, FIG. 19(A) and FIG. 19(B) show results of the pole measurement on Sample 5. FIG. 19(A) shows a result for the (111) plane of the single crystal substrate of Sample 5, and FIG. 19(B) shows a result for the (101) plane of the metal oxynitride film of Sample 5.

As shown by solid-line circles in FIG. 19(A), spot-like intensity distribution was observed at three points on a concentric circle with an angle ψ of approximately 70°. In addition, as shown by solid-line circles in FIG. 19(B), spot-like intensity distribution was observed at six points on a concentric circle with an angle ψ of approximately 62°. In other words, the (101) plane of the metal oxynitride film of Sample 5 has six-fold symmetry, showing that the metal oxynitride film of Sample 5 has in-plane orientation. In addition, an angle formed by the (002) plane and the (101) plane of the wurtzite structure is approximately 62°, which indicates that the crystal included in the metal oxynitride film of Sample 5 has a wurtzite structure. Furthermore, it is found from FIG. 19(A) and FIG. 19(B) that the metal oxide film of Sample 5 is a c-axis epitaxial film that does not have domains in which the crystal orientation is rotated in the film plane.

The above shows that the metal oxynitride film of Sample 5 has a wurtzite structure and is epitaxially grown.

<Evaluation of Sample 6>

Figure 20B:
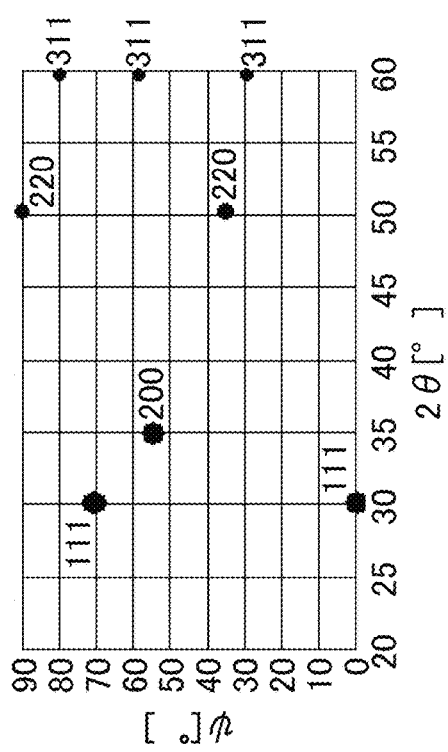
FIG. 20(B) and FIG. 20(C) are diagrams showing wide-angle reciprocal space maps obtained by simulation.
Figure 20C:
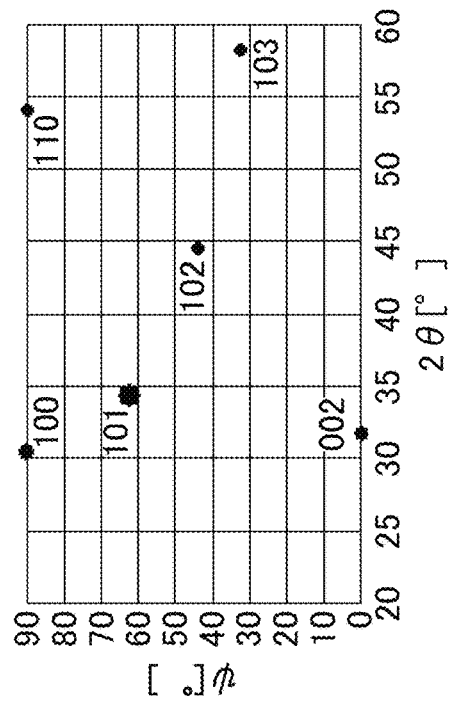
Figure 20A:
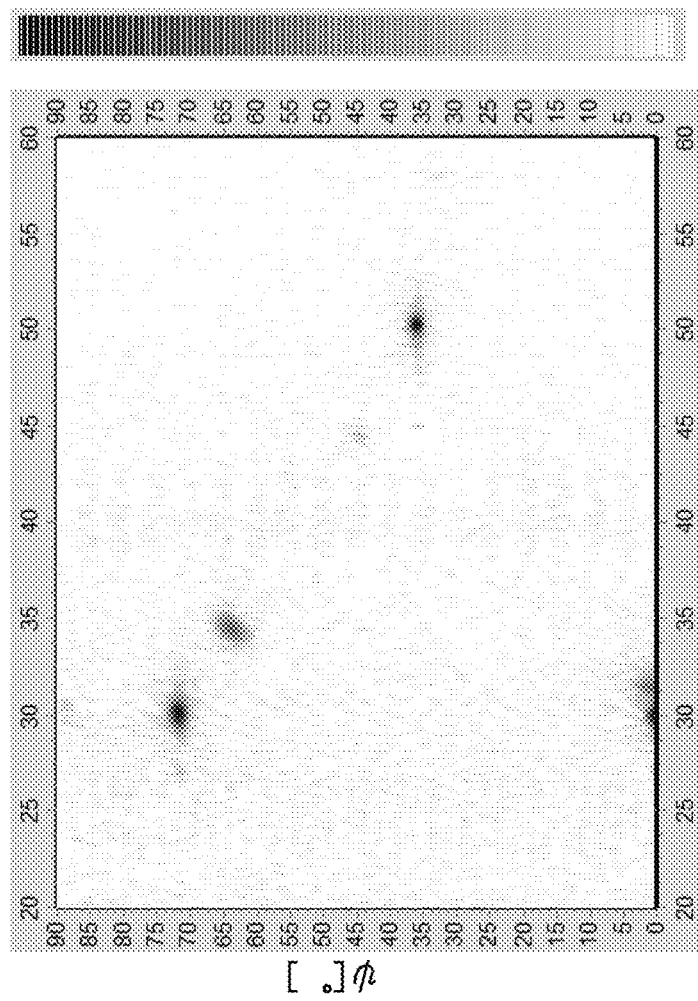
FIG. 20(A) is a diagram showing a wide-angle reciprocal space map of Sample 6 of Example

FIG. 20(A) shows a wide-angle reciprocal space map of Sample 6. FIG. 20(B) and FIG. show wide-angle reciprocal space maps obtained by simulation. FIG. 20(B) is a wide-angle reciprocal space map corresponding to the single crystal substrate of Sample 6, and FIG. 20(C) is a wide-angle reciprocal space map corresponding to the crystal included in the metal oxynitride film of Sample 6.

A plurality of spots were observed in FIG. 20(A). Comparison between the plurality of observed spots and spots shown in FIG. 20(B) and FIG. 20(C) indicates that the spot with a peak positioned at an angle 2θ of approximately 35° and an angle ψ of approximately 62° corresponds to the (101) plane of the wurtzite structure, and the spot with a peak positioned at an angle 2θ of approximately 44° and an angle ψ of approximately 44° corresponds to the (102) plane of the wurtzite structure.

Next, FIG. 21(A) and FIG. 21(B) show results of the pole measurement on Sample 6. FIG. 21(A) shows a result for the (111) plane of the single crystal substrate of Sample 6, and FIG. 21(B) shows a result for the (101) plane of the metal oxynitride film of Sample 6.

As shown by solid-line circles in FIG. 21(A), spot-like intensity distribution was observed at three points on a concentric circle with an angle ψ of approximately 70°. In addition, as shown by solid-line circles in FIG. 21(B), spot-like intensity distribution was observed at six points on a concentric circle with an angle ψ of approximately 62°. In other words, the (101) plane of the metal oxynitride film of Sample 6 has six-fold symmetry, showing that the metal oxynitride film of Sample 6 has in-plane orientation. In addition, an angle formed by the (002) plane and the (101) plane of the wurtzite structure is approximately 62°, which indicates that the crystal included in the metal oxynitride film of Sample 6 has a wurtzite structure. Furthermore, it is found from FIG. 21(A) and FIG. 21(B) that the metal oxide film of Sample 6 is a c-axis epitaxial film that does not have domains in which the crystal orientation is rotated in the film plane.

The above shows that the metal oxynitride film of Sample 6 has a wurtzite structure and is epitaxially grown.

<Evaluation of Sample 7>

Figure 22B:
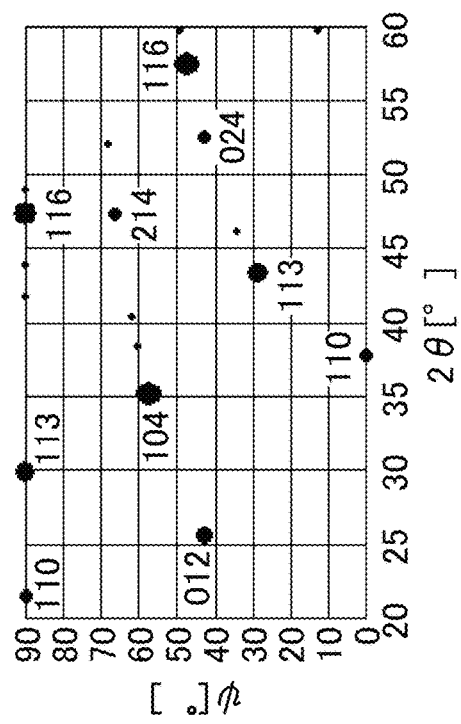
FIG. 22(B) and FIG. 22(C) are diagrams showing wide-angle reciprocal space maps obtained by simulation.
Figure 22C:
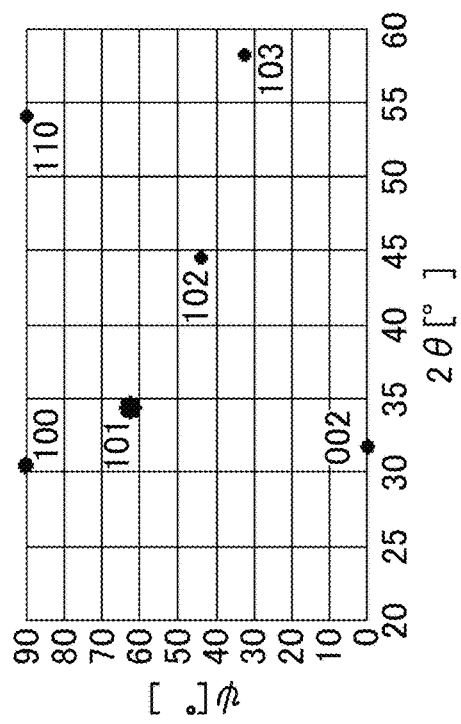
Figure 22A:
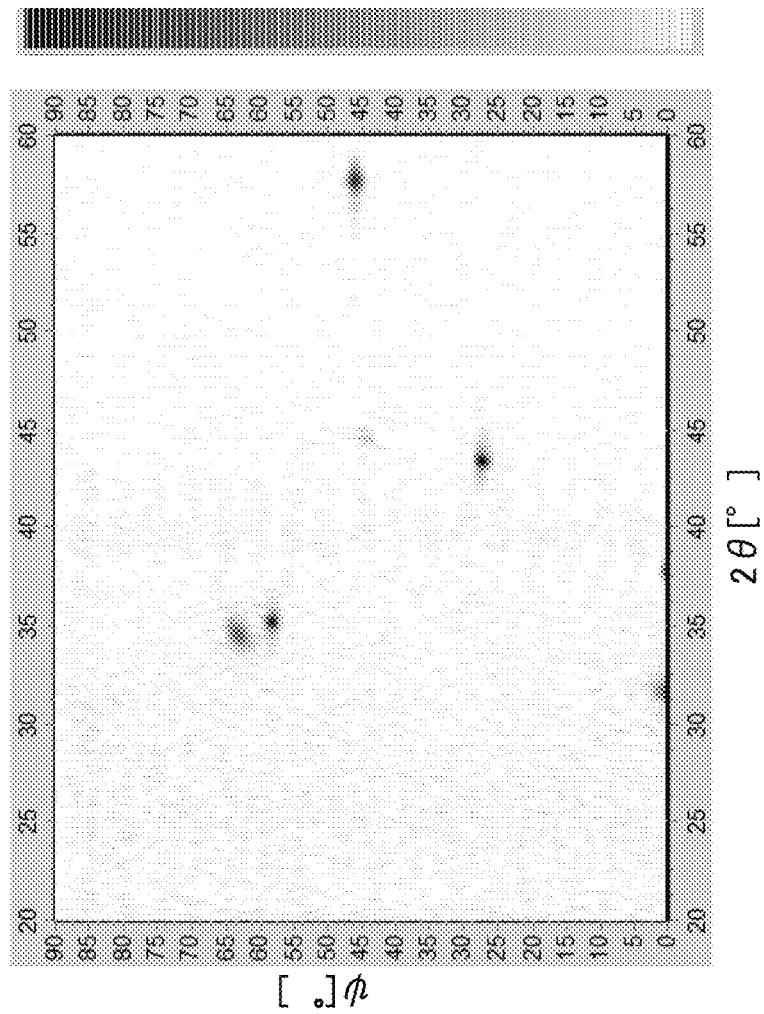
FIG. 22(A) is a diagram showing a wide-angle reciprocal space map of Sample 7 of Example

FIG. 22(A) shows a wide-angle reciprocal space map of Sample 7. FIG. 22(B) and FIG. 22(C) show wide-angle reciprocal space maps obtained by simulation. FIG. 22(B) is a wide-angle reciprocal space map corresponding to the single crystal substrate of Sample 7, and FIG. 22(C) is a wide-angle reciprocal space map corresponding to the crystal included in the metal oxynitride film of Sample 7.

A plurality of spots were observed in FIG. 22(A). Comparison between the plurality of observed spots and spots shown in FIG. 22(B) and FIG. 22(C) indicates that the spot with a peak positioned at an angle 2θ of approximately 35° and an angle ψ of approximately 62° corresponds to the (101) plane of the wurtzite structure, and the spot with a peak positioned at an angle 2θ of approximately 44° and an angle ψ of approximately 44° corresponds to the (102) plane of the wurtzite structure.

Figure 23A:
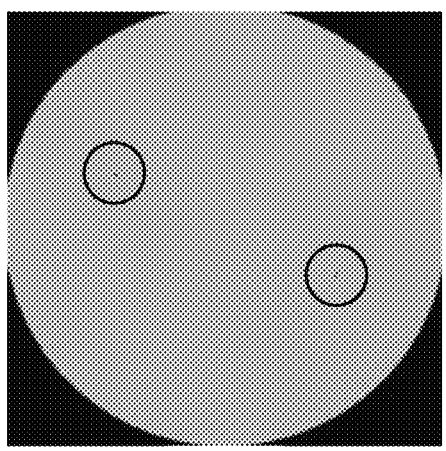
FIG. 23(A) and FIG. 23(B) are diagrams showing results of pole measurement on Sample 7 of Example.
Figure 23B:
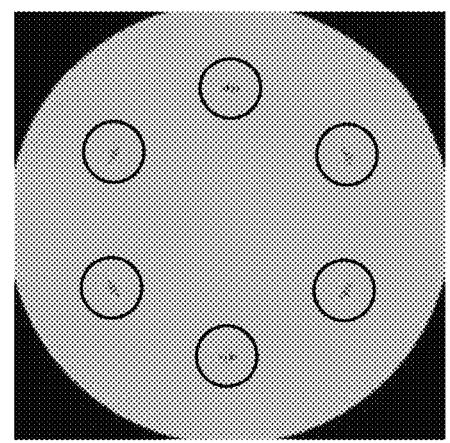

Next, FIG. 23(A) and FIG. 23(B) show results of the pole measurement on Sample 7. FIG. 23(A) shows a result for the (104) plane of the single crystal substrate of Sample 7, and FIG. 23(B) shows a result for the (101) plane of the metal oxynitride film of Sample 7.

As shown by solid-line circles in FIG. 23(A), spot-like intensity distribution was observed at two points on a concentric circle with an angle ψ of approximately 58°. The spots are two-fold symmetry spots derived from the (104) plane of A-plane sapphire. In addition, as shown by solid-line circles in FIG. 23(B), spot-like intensity distribution was observed at six points on a concentric circle with an angle ψ of approximately 62°. That is, the (101) plane of the metal oxynitride film of Sample 7 has six-fold symmetry, showing that the metal oxynitride film of Sample 7 has in-plane orientation. In addition, an angle formed by the (002) plane and the (101) plane of the wurtzite structure is approximately 62°, which indicates that the crystal included in the metal oxynitride film of Sample 7 has a wurtzite structure. Furthermore, it is found from FIG. 23(A) and FIG. 23(B) that the metal oxide film of Sample 7 is a c-axis epitaxial film that does not have domains in which the crystal orientation is rotated in the film plane.

The above shows that the metal oxynitride film of Sample 7 has a wurtzite structure and is epitaxially grown.

At least part of the structure, the method, and the like described in this example can be implemented in appropriate combination with other embodiments described in this specification.

REFERENCE NUMERALS

10: substrate, 20: metal oxynitride film, 30: crystal, 41: deposition chamber, 50a: backing plate, 50b: backing plate, 52a: target holder, 52b: target holder, 54a: magnet unit, 54b: magnet unit, 54N1: magnet, 54N2: magnet, 54S: magnet, 56: magnet holder, 58: member, 60: substrate, 62: substrate holder, 64a: magnetic line of force, 64b: magnetic line of force, 70a: sputtering target, 70b: sputtering target, 100: light-emitting element, 102: substrate, 104: clad layer, 106: active layer, 108: clad layer, 110: n-type electrode, 112: p-type electrode, 400: display device, 401: pixel unit, 402: driver circuit, 403: driver circuit, 5001: display unit, 5002: dashboard, 5003: steering wheel, 5004: windshield, 5005: camera, 5006: ventilation duct, 5007: display panel, 5007a: display panel, 5007b: display panel, 5007c: display panel, 5007d: display panel, 7000: display unit, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker,

7311: information terminal, 7400: digital signage, 7401: pillar, 7411: information terminal, 7900: automobile, 7901: car body, 7902: wheel, 7903: windshield, 7904: light, 7905: fog lamp, 8501: lighting device, 8502: lighting device, 8503: lighting device, 8504: lighting device

The invention claimed is:

1. An element comprising a metal oxynitride film,
   wherein the metal oxynitride film is provided on a single crystal substrate,
   wherein the metal oxynitride film comprises zinc, indium, and gallium,
   wherein the metal oxynitride film is an in-plane oriented film having regularity of crystal orientation in a horizontal direction with respect to the single crystal substrate by c-axis epitaxial growth,
   wherein a first spot and a second spot are observed in a wide-angle reciprocal space map of the metal oxynitride film,
   wherein a peak of the first spot is positioned at an angle $2\theta$ of greater than or equal to 30° and less than or equal to 35° and an angle $\psi$ of around 0°, and
   wherein a peak of the second spot is positioned at an angle $2\theta$ of greater than or equal to 33° and less than or equal to 37° and an angle $\psi$ of greater than or equal to 61° and less than or equal to 65°.

2. The element according to claim 1,
   wherein the single crystal substrate is an yttria-stabilized zirconia (YSZ) substrate, and
   wherein a plane orientation of the yttria-stabilized zirconia (YSZ) substrate is (111).

3. The element according to claim 1,
   wherein the single crystal substrate is a sapphire substrate, and
   wherein a plane orientation of the sapphire substrate is (110).

4. The element according to claim 1, wherein a crystal structure of the metal oxynitride film is a wurtzite structure.

5. The element according to claim 1, wherein when pole measurement is performed on the metal oxynitride film, a diffraction peak indicating six-fold symmetry is observed in a $\varphi$ scan on a (101) plane of a crystal of the metal oxynitride film in the pole measurement.

6. The element according to claim 1,
   wherein a half-width of the first spot is less than 2°, and equal to 65°, and
   wherein a half-width of the second spot is less than 2°.

7. A display device comprising:
   a light-emitting element comprising the element according to claim 1; and
   a transistor electrically connected to the light-emitting element.

8. An element comprising a metal oxynitride film,
   wherein the metal oxynitride film is provided on a surface of a single crystal substrate,
   wherein the metal oxynitride film comprises zinc, indium, and gallium,
   wherein the metal oxynitride film is a c-axis epitaxial film in which a c-axis direction of crystals corresponds to a normal direction of the surface of the single crystal substrate,
   wherein a first spot and a second spot are observed in a wide-angle reciprocal space map of the metal oxynitride film,
   wherein a peak of the first spot is positioned at an angle $2\theta$ of greater than or equal to 30° and less than or equal to 35° and an angle w of around 0°, and
   wherein a peak of the second spot is positioned at an angle $2\theta$ of greater than or equal to 33° and less than or equal to 37° and an angle $\psi$ of greater than or equal to 61° and less than or equal to 65°.

9. The element according to claim 8,
   wherein the single crystal substrate is an yttria-stabilized zirconia (YSZ) substrate, and
   wherein a plane orientation of the yttria-stabilized zirconia (YSZ) substrate is (111).

10. The element according to claim 8,
    wherein the single crystal substrate is a sapphire substrate, and
    wherein a plane orientation of the sapphire substrate is (110).

11. The element according to claim 8, wherein a crystal structure of the metal oxynitride film is a wurtzite structure.

12. The element according to claim 8, wherein when pole measurement is performed on the metal oxynitride film, a diffraction peak indicating six-fold symmetry is observed in a $\varphi$ scan on a (101) plane of a crystal of the metal oxynitride film in the pole measurement.

13. The element according to claim 8,
    wherein a half-width of the first spot is less than 2°, and
    wherein a half-width of the second spot is less than 2°.

14. A display device comprising:
    a light-emitting element comprising the element according to claim 8; and
    a transistor electrically connected to the light-emitting element.

15. A display device comprising:
    a light-emitting element comprising a metal oxynitride film formed on a surface of a single crystal substrate,
    wherein the metal oxynitride film comprises zinc, indium, and gallium,
    wherein the metal oxynitride film is c-axis epitaxial film in which a c-axis direction of crystals corresponds to a normal direction of the surface of the single crystal substrate,
    wherein a crystal structure of the metal oxynitride film is a wurtzite structure,
    wherein a first spot and a second spot are observed in a wide-angle reciprocal space map of the metal oxynitride film,
    wherein a peak of the first spot is positioned at an angle $2\theta$ of greater than or equal to 30° and less than or equal to 35° and an angle $\psi$ of around 0°, and
    wherein a peak of the second spot is positioned at an angle $2\theta$ of greater than or equal to 33° and less than or equal to 37° and an angle $\psi$ of greater than or equal to 61° and less than or equal to 65°.

16. The display device according to claim 15,
    wherein the single crystal substrate is an yttria-stabilized zirconia (YSZ) substrate, and
    wherein a plane orientation of the yttria-stabilized zirconia (YSZ) substrate is (111).

17. The display device according to claim 15,
    wherein the single crystal substrate is a sapphire substrate, and
    wherein a plane orientation of the sapphire substrate is (110).

18. The display device according to claim 15, wherein when pole measurement is performed on the metal oxynitride film, a diffraction peak indicating six-fold symmetry is observed in a $\psi$ scan on a (101) plane of a crystal of the metal oxynitride film in the pole measurement.

19. The display device according to claim 15,
wherein a half-width of the first spot is less than 2°, and
wherein a half-width of the second spot is less than 2°.

20. The display device according to claim 15, further comprising:
   a transistor electrically connected to the light-emitting element.

\* \* \* \* \*